US012772749B2

(12) United States Patent
Graettinger et al.

(10) Patent No.: US 12,772,749 B2
(45) Date of Patent: Oct. 20, 2026

(54) MEMORY DEVICE WITH LATERALLY FORMED MEMORY CELLS

(71) Applicant: Micron Technology, Inc., Boise, ID (US)

(72) Inventors: Thomas M. Graettinger, Boise, ID (US); Lorenzo Fratin, Buccinasco (IT); Patrick M. Flynn, Boise, ID (US); Enrico Varesi, Milan (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 365 days.

(21) Appl. No.: 18/545,636

(22) Filed: Dec. 19, 2023

(65) Prior Publication Data

US 2024/0196765 A1 Jun. 13, 2024

Related U.S. Application Data

(62) Division of application No. 17/332,628, filed on May 27, 2021, now Pat. No. 11,864,475.

(51) Int. Cl.
*H10N 70/00* (2023.01)

(52) U.S. Cl.
CPC ....... *H10N 70/8265* (2023.02); *H10N 70/021* (2023.02); *H10N 70/841* (2023.02); *H10N 70/882* (2023.02); *H10N 70/883* (2023.02)

(58) Field of Classification Search
CPC ............. H10N 70/8265; H10N 70/021; H10N 70/841; H10N 70/882; H10N 70/883;
(Continued)

(56) References Cited

U.S. PATENT DOCUMENTS 10,128,437 B1 * 11/2018 Fantini ................. H10N 70/021
10,256,406 B2 4/2019 Collins et al.
(Continued)

FOREIGN PATENT DOCUMENTS

CN 112020777 A 12/2020
KR 10-2013-0028791 A 3/2013

OTHER PUBLICATIONS

"International Search Report and Written Opinion of the International Searching Authority," issued in connection with Int'l Appl. No. PCT/US2022/072318 dated Sep. 1, 2022 (9 pages).
(Continued)

*Primary Examiner* — Allison Bernstein
(74) *Attorney, Agent, or Firm* — Holland & Hart LLP

(57) ABSTRACT

Methods, systems, and devices for a memory device with laterally formed memory cells are described. A material stack that includes a conductive layer between multiple dielectric layers may be formed, where the conductive layer and dielectric layers may form a channel in a sidewall of the material stack. The channel may be filled with one or more materials, where a first side of an outermost material of the one or more materials may be exposed. An opening may be formed in the material stack that exposes a second side of at least one material of the one or more materials. The opening may be used to replace a portion of the at least one material with a chalcogenide material where the electrode materials may be formed before replacing the portion of the at least one material with the chalcogenide material.

17 Claims, 20 Drawing Sheets

(58) Field of Classification Search
CPC .... H10N 70/011; H10N 70/066; H10N 70/20; H10N 70/231; H10N 70/823; H10N 70/8825; H10B 63/845
See application file for complete search history.

(56) References Cited

U.S. PATENT DOCUMENTS

| | | | | |
|---|---|---|---|---|
| 10,490,602 | B2 | 11/2019 | Pellizzer et al. | |
| 10,546,998 | B2 | 1/2020 | Hopkins | |
| 10,593,399 | B2 | 3/2020 | Fratin et al. | |
| 10,700,128 | B1 | 6/2020 | Fantini et al. | |
| 2012/0012921 | A1 | 1/2012 | Liu | |
| 2014/0131784 | A1 | 5/2014 | Davis et al. | |
| 2015/0243708 | A1* | 8/2015 | Ravasio | H10B 63/80 257/4 |
| 2016/0071860 | A1 | 3/2016 | Kai et al. | |
| 2016/0307963 | A1 | 10/2016 | Hineman et al. | |
| 2018/0315475 | A1 | 11/2018 | Redaelli et al. | |
| 2019/0044062 | A1 | 2/2019 | Fantini | |
| 2019/0252605 | A1 | 8/2019 | Redaelli et al. | |
| 2020/0303639 | A1 | 9/2020 | He et al. | |
| 2020/0350203 | A1 | 11/2020 | Fratin et al. | |
| 2021/0005665 | A1 | 1/2021 | Fantini et al. | |
| 2021/0167127 | A1 | 6/2021 | Castro et al. | |
| 2022/0384720 | A1 | 12/2022 | Fratin et al. | |

OTHER PUBLICATIONS

PCT Patent Application No. PCT/IB2020/020041, by Fratin et al., filed Jul. 22, 2020 (53 pages).
PCT Patent Application No. PCT/IB2020/020042, by Fratin et al., filed Jul. 22, 2020 (53 pages).
Chinese patent office, "China Office Action," issued in connection with China Patent Application No. 202280037225.7 dated May 26, 2024 (7 pages) (2 pages of English Translation and 5 pages of Original Document).
European Patent Office, "Extended Search Report," issued in connection with European Patent Application No. 22812358.4 dated Aug. 8, 2024 (7 pages).

* cited by examiner

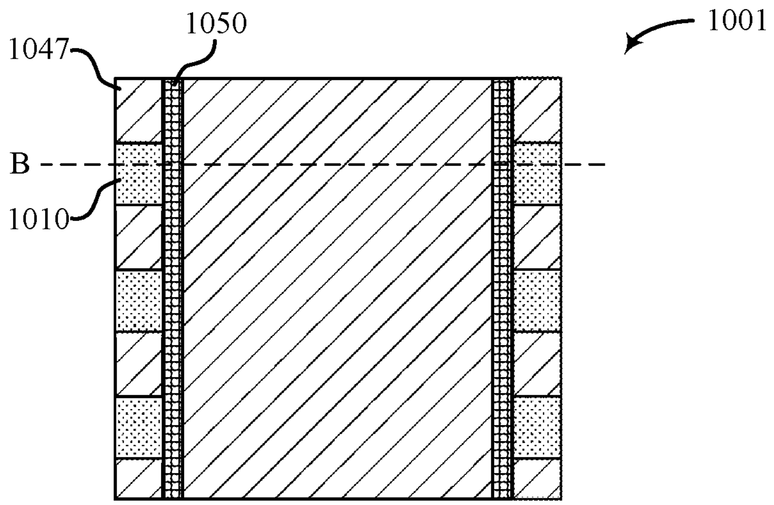
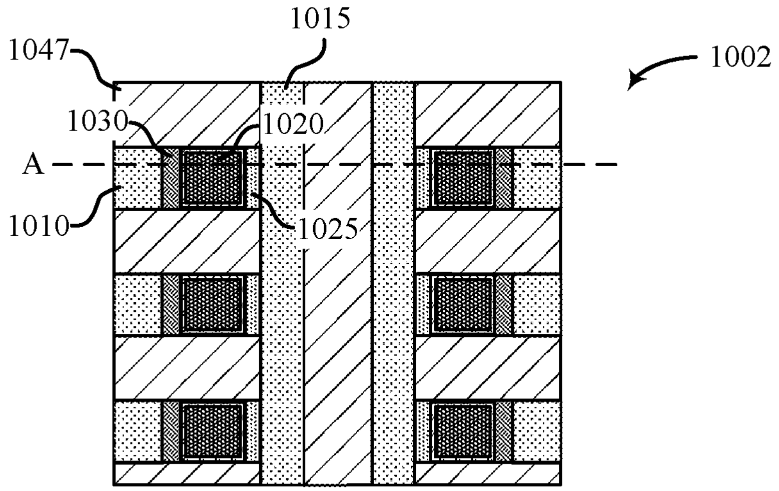
FIG. 10
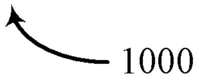

MEMORY DEVICE WITH LATERALLY FORMED MEMORY CELLS

CROSS REFERENCE

The present Application for Patent is a divisional of U.S. patent application Ser. No. 17/332,628 by Graettinger et al., entitled "MEMORY DEVICE WITH LATERALLY FORMED MEMORY CELLS," filed May 27, 2021, assigned to the assignee hereof, and is expressly incorporated by reference in its entirety herein.

FIELD OF TECHNOLOGY

The following relates generally to one or more systems for memory and more specifically to a memory device with laterally formed memory cells.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

BRIEF DESCRIPTION OF THE DRAWINGS

FIG. 10 illustrates multiple views of a material structure associated with laterally formed memory cells in accordance with examples as disclosed herein.

DETAILED DESCRIPTION

Figure 1:
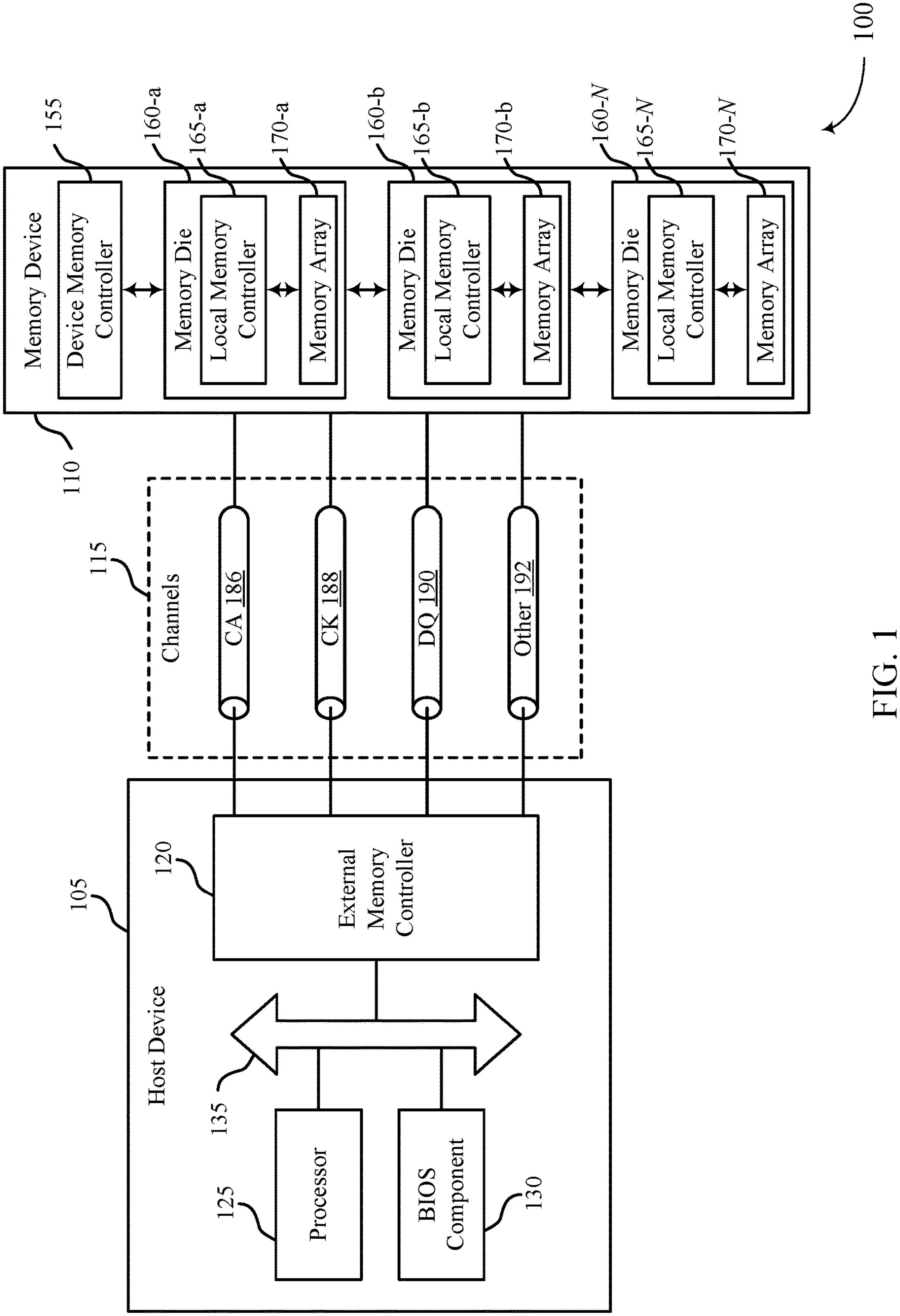
FIG. 1 illustrates an example of a system that supports a memory device with laterally formed memory cells in accordance with examples as disclosed herein.

A vertical memory array may include horizontally-disposed memory cells that are vertically stacked (e.g., with intervening layers such as dielectric layers separating vertically-stacked, horizontally-disposed memory cells). A process for forming horizontally-disposed memory cells in a vertical memory array may include creating a horizontally-disposed cavity and filling the cavity from an inside out. For example, the process may involve filling a back portion of the cavity by depositing a first material on a back wall of the cavity, filling a second portion of the cavity by depositing a second material on the first material, and filling a third portion of the cavity on by depositing a third material on the second material.

Larger cells may be associated with larger programming and leakage currents (e.g., four times the programming current and leakage current may be associated with a cell that is four times large than another cell). Thus, processes for forming horizontally-disposed memory cells with smaller dimensions may be desired. However, filling a cavity from the inside out to form a horizontally-disposed memory cell may raise challenges when forming memory cells with smaller dimensions (e.g., with a diameter or a width in the 20 nanometer range). In some examples, processes for creating vertical openings for accessing the cavities that are aligned with the cavities may be subject to photolithographic processes and tight tolerances. Moreover, as a size of the memory cell (and thus the cavity) is reduced, a proper alignment of the vertical openings and cavities may be more difficult to obtain. Accordingly, a process for forming a vertical memory array that involves filling a cavity from an inside out to form a memory cell may be limited to larger memory cell sizes. Additionally, filling a cavity from the inside out may involve the formation of an electrode after the formation of the storage element. To avoid damage to the storage element, low temperatures may be desired to form the electrode, which may be infeasible or may hinder the formation of the electrode.

To simplify a process for forming memory cells in a vertical array and to enable the formation of smaller memory cells, a formation process that involves exposing and filling the cavities from a lateral side (rather than from an inside out) may be established. In some examples, the formation process may include depositing, for example via a trench, one or more placeholder materials for the components of the memory cell into channels formed by the material layers. The formation process may also include forming a vertical opening that exposes a lateral side of the one or more placeholder materials. The vertical opening may be used to replace a portion of the one or more placeholder materials with a material for a corresponding component of the memory cell (e.g., an electrode or storage element). In some examples, the formation process may replace a subset of the one or more placeholder materials with materials associated with electrodes before replacing a placeholder material of the one or more placeholder materials with a material associated with a storage element (which may be referred to as an "electrode first" filling process where the electrode structures are formed before the memory cell structure) which can minimize adverse effects that may otherwise occur when the memory cell structure is formed before the electrode structures, among other advantages.

By creating a vertical opening that exposes a lateral side of the placeholder materials, a larger opening may be used and an operation for aligning the vertical opening with a cavity may be avoided. Also, by exposing the lateral side of the placeholder materials, the placeholder materials associated with the electrode may be replaced before the placeholder material associated with a storage element (e.g., enabling the electrodes to be formed using higher temperatures and without damaging the storage element). Additionally, forming a storage element from a lateral direction, may prevent exposure of a side of the storage element that intersects with a conductive path through the storage element from formation processes that may alter characteristics of the side of the storage element.

Features of the disclosure are initially described in the context of memory systems, dies, and arrays. Features of the disclosure are also described in the context of different perspective of a material structure and stages of one or more formation processes. These and other features of the disclosure are further illustrated by and described with reference to flowcharts that relate to a memory device with laterally formed memory cells.

FIG. 1 illustrates an example of a system 100 that supports a memory device with laterally formed memory cells in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as groups, levels, layers, or dies. A 3D memory die 160 may include any quantity of stacked memory arrays 170 (e.g., two high, three high, four high, five high, six high, seven high, eight high). In some 3D memory dies 160, different groups may share at least one common access line such that some groups may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110.

The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory die 160 may include a memory array formed from a material stack (which may also be referred to as a material structure). In some examples, the material stack includes a conductive layer between multiple dielectric layers, where the conductive layer and dielectric layers may form a channel in a sidewall of the material stack. The channel may be filled with one or more materials (e.g., a conductive material, one or more placeholder material, or any combination thereof), where a first side of an outermost material of the one or more materials may be exposed. An opening may be formed in the material stack that exposes a second (e.g., lateral) side of at least one material (e.g., a placeholder material for a storage element) of the one or more materials. The opening may be used to replace a portion of the at least one material with a chalcogenide material (e.g., to form a storage element).

Figure 2:
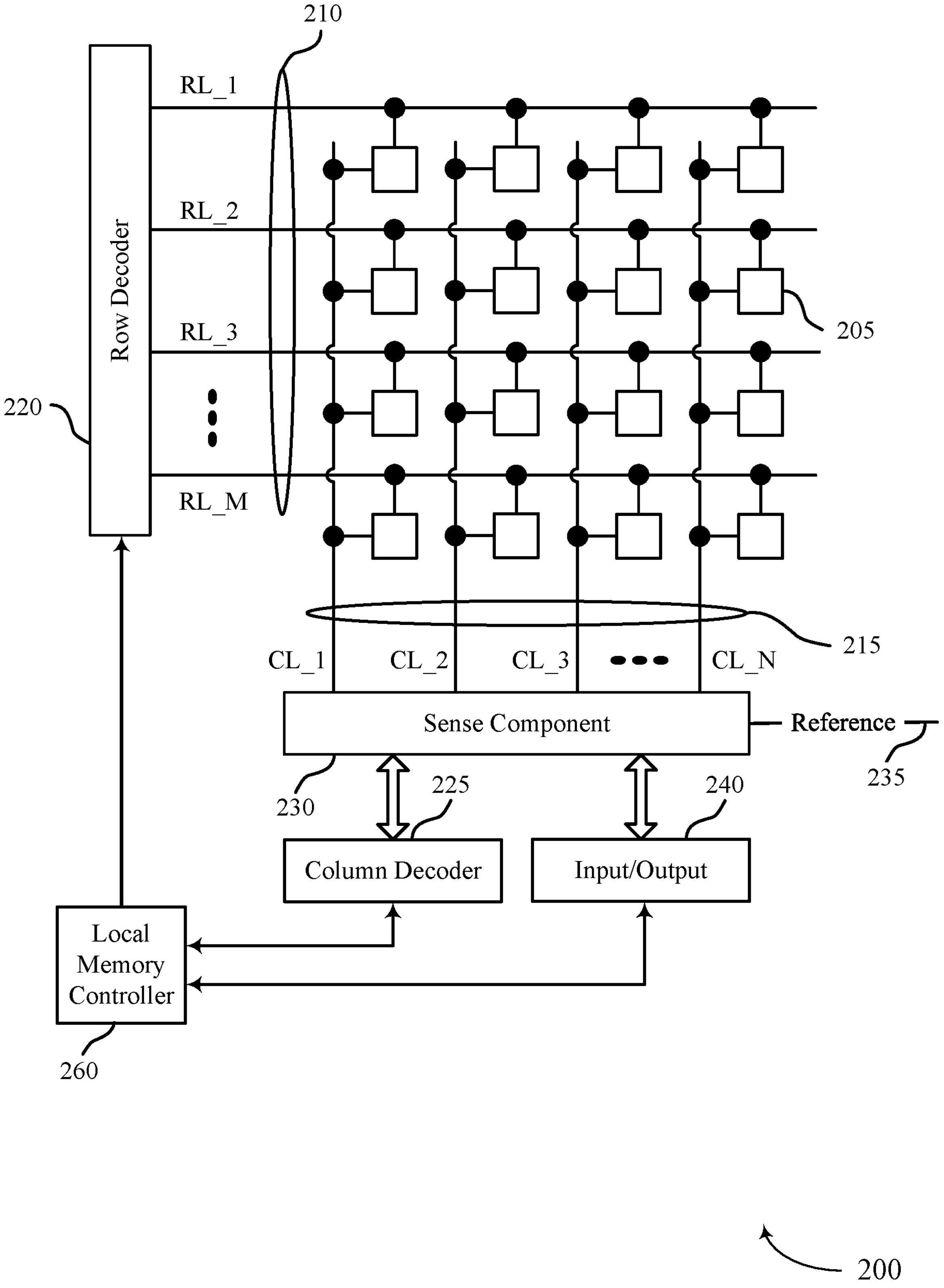
FIG. 2 illustrates an example of a memory die that supports a memory device with laterally formed memory cells in accordance with examples as disclosed herein.

FIG. 2 illustrates an example of a memory die 200 that supports a memory device with laterally formed memory cells in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIGS. 3A and 3B. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

Memory die 200 may be formed from a material stack (which may also be referred to as a material structure). In some examples, the material stack includes a conductive layer between multiple dielectric layers, where the conductive layer and dielectric layers may form a channel in a sidewall of the material stack. The channel may be filled with one or more materials (e.g., a conductive material, one or more placeholder material, or any combination thereof), where a first side of an outermost material of the one or more materials may be exposed. An opening may be formed in the material stack that exposes a second (e.g., lateral) side of at least one material (e.g., a placeholder material for a storage element) of the one or more materials. As part of a process for forming one or more memory cells 205, the opening may be used to replace a portion of the at least one material with a chalcogenide material (e.g., to form a storage element).

Figure 3A:
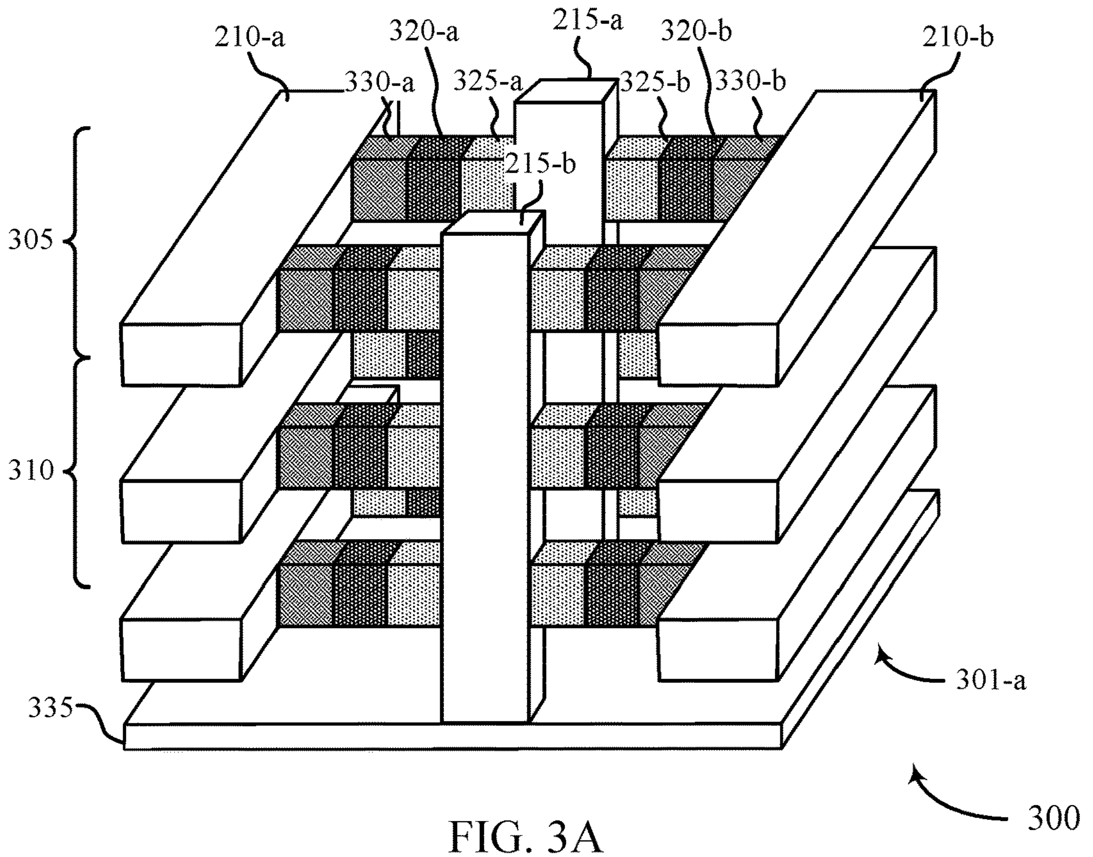
FIGS. 3A and 3B illustrate multiple views of a vertical memory array having horizontally-disposed memory cells in accordance with examples as disclosed herein.
Figure 3B:
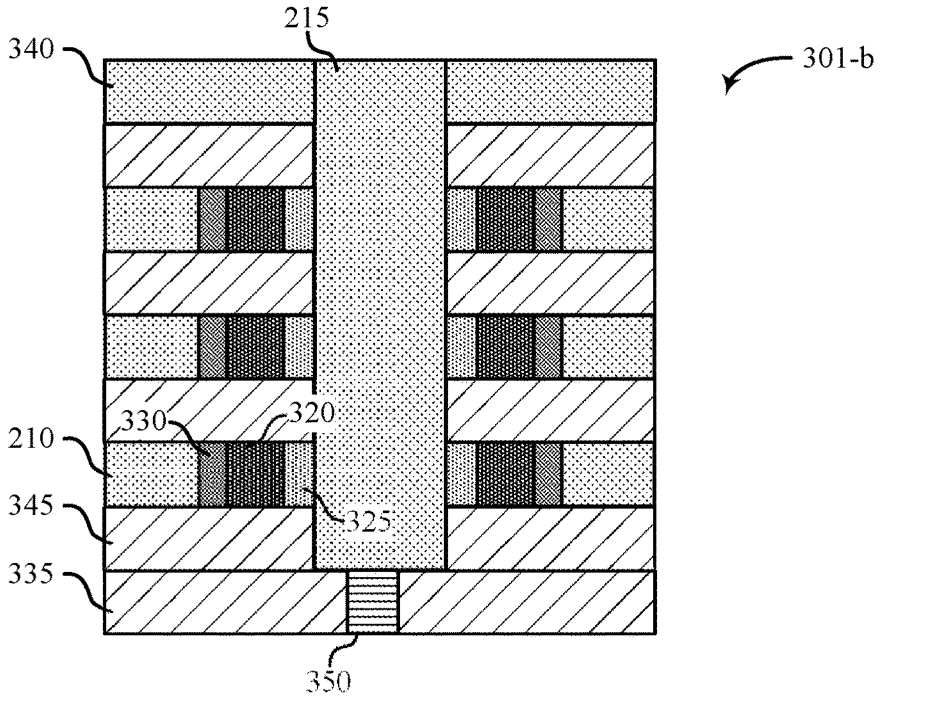

FIGS. 3A and 3B illustrate multiple views of a vertical memory array having horizontally-disposed memory cells in accordance with examples as disclosed herein. Memory array 300 may be an example of portions of the memory arrays or memory dies described with reference to FIGS. 1 and 2.

First perspective 301-*a* shows a three-dimensional view of memory array 300. The memory array 300 may include a first group 305 and a second group 310 of memory cells that is positioned above a substrate 335. The first group 305 may be positioned above the second group 310. Though the example of memory array 300 includes three groups (including first group 305 and second group 310), the memory array 300 may include any quantity of groups (e.g., one group, two groups, or more than three groups).

Memory array 300 may also include a row line 210-*a*, a row line 210-*b*, a column line 215-*a*, and a column line 215-*b*, which may be examples of row lines 210 and column lines 215, as described with reference to FIG. 2. In some examples, a row line 210 may be referred to as a word line, and a column line 215 may be referred to as a bit line or digit line. The column lines 215 may be formed as vertical pillars and extend normal (or perpendicular) to the plane defined by substrate 335. The row lines 210 may extend parallel to the plane defined by substrate 335.

A first set of memory cells of the first group 305 may include one or more chalcogenide materials in a laterally-disposed pillar between a set of access lines (e.g., between row line 210-*a* and digit line 215-*a* or between row line 210-*a* and digit line 215-*b*) and a second set of memory cells of the first group 305 may include one or more chalcogenide material in a laterally-oriented pillar between another set of access lines (e.g., between digit line 215-*a* and row line 210-*b* or between digit line 215-*b* and row line 210-*b*). For example, a single laterally-oriented pillar (which may also be referred to as a bridge or rail) that extends between access lines may include a first electrode, a first chalcogenide material (e.g., selector component), a second electrode, a second chalcogenide material (e.g., storage element), a third electrode, or any combination thereof. Although some elements included in FIGS. 3A and 3B are labeled with a numeric indicator, other corresponding elements are not labeled, although they are the same or would be understood to be similar, in an effort to increase visibility and clarity of the depicted features.

A first memory cell of the first group 305 may include a first electrode 325-*a*, a storage element 320-*a*, a second electrode 330-*a*, or any combination thereof. A second memory cell of the first group 305 may include a first electrode 325-*b*, a storage element 320-*b*, a second electrode 330-*b*, or any combination thereof. The storage elements 320 may be examples of a chalcogenide material, such as a phase change storage element, a thresholding storage element, or a self-selecting storage element. The memory cells of the first group 305 may, in some examples, have common conductive lines such that corresponding memory cells of the first group 305 (e.g., the first memory cell and the second memory cell) may share column lines 215. For example, the first electrode 325-*b* of the second memory cell and the first electrode 325-*a* of the first memory cell may be coupled with column line 215-*a*. In some examples, the electrode contacting a column line 215 may be referred to as a top electrode (e.g., a first electrode 325) and the electrode contacting a row line 210 may be referred to as a bottom electrode (e.g., a second electrode 330)). In some examples, a direction of a current path from a first electrode 325 to a second electrode 330) through a storage element 320 is parallel to a plane defined by substrate 335.

In some examples, memory cells in the first group 305 may share a common row line while being connected to different column lines. Also, in some examples, memory cells of the first group 305 may share column lines with memory cells of the second group 310. For example, a memory cell in the first group 305 may share column line 215 with a memory cell in the second group 310.

In some examples, the material of the storage element 320 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as a SiSAG-alloy. In some examples, a SAG-alloy may include silicon (Si) or indium (In), or any combination thereof, and such chalcogenide materials may be referred to as SiSAG-alloy or InSAG-alloy, respectively, or any combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change (e.g., at least part of the material may change phases) or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., first electrode 325-*a*, storage element 320-*a*, second electrode 330-*a*), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state.

To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states. In some examples, such as for thresholding memory cells or self-selecting memory cells, some or all of the set of logic states supported by the memory cells may be associated with an amorphous state of the chalcogenide material (e.g., the material in a single state may be operable to store different logic states).

In some examples, a horizontally-disposed memory cell may be an example of a self-selecting memory cell. In such examples, the material used in the storage element 320) may be based on an alloy (such as the alloys listed above). The storage element 320 may be operated so as to undergo a change to a different physical state during normal operation of the memory cell. For example, a self-selecting memory cell may be programmed to have a high threshold voltage state or a low threshold voltage state. A high threshold voltage state may correspond to a first logic state (e.g., a RESET state) and a low threshold voltage state may correspond to a second logic state (e.g., a SET state). The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

As a result of having a programmable threshold voltage, current may flow through a storage element 320 when a voltage applied across the storage element 320 exceeds a programmed threshold voltage. Thus, an operation for accessing one self-selecting memory cell may not disturb a state of another self-selecting memory cell (e.g., that has a higher threshold voltage) that is coupled with a common access line. Accordingly, self-selecting memory cells may not be coupled with a selection element (e.g., a transistor or diode) for isolating the self-selecting memory cell from voltages applied to electrically-coupled memory cells.

The architecture of memory array 300 may be referred to as a cross-point architecture, where a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

Although the example of FIG. 3A shows a memory group with two laterally adjacent layers memory cells, other configurations are possible. In some examples, a memory group includes a single layer of laterally-disposed, which may be referred to as a two-dimensional memory. Further, in some cases, elements shown in or described with reference to FIG. 3A may be electrically coupled with one another as shown or described but rearranged physically (e.g., a storage element 320 and possibly a selection element or an electrode may be electrically in series between a row line 210 and a column line 215 but need not be in a pillar or stack).

Second perspective 301-*b* shows a cross-sectional view of memory array 300 looking from a front of memory array 300. Second perspective 301-*b* shows additional material layers included in memory array 300 that are not depicted in first perspective 301-*a* (to increase visibility and clarity of the depicted features). Second perspective 301-*b* shows dielectric layers 345 between row lines 210. Second perspective 301-*b* also shows a second substrate 340 on an opposing side of the memory array 300 relative to substrate 335.

The architecture of memory array 300 may be referred to as a cross point architecture, a vertical memory architecture, or both, and memory array 300 may be referred to as a vertical memory array. A vertical memory array may be formed by depositing alternating layers of conductive and insulative materials on top of one another: forming a trench that passes through the alternating material layers (e.g., in a serpentine fashion by etching): and using the trench to form horizontally-disposed memory cells relative to a substrate (e.g., substrate 335 or second substrate 340) by one or more deposition operations. In some examples, conductive contacts 350 are embedded within substrate 335 and may be used to access an access line (e.g., a column line 215). In some examples, a first material layer (e.g., an insulative material layer that includes dielectric layer 345) may be formed on top of substrate 335, a second material layer (e.g., a conductive material layer that includes row line 210) may be formed on top of the first material layer, a third material layer (e.g., an insulative material layer that includes another dielectric layer) may be formed on top of the second material layer, and so on. After the alternating material layers is formed, portions of the material layers may be removed (e.g., using an etching process) to form a trench.

In some examples, the trench may extend through the space occupied by column line 215—before column line 215 is formed. In some examples, the trench may be used to split the conductive and insulative layers into two portions and to horizontally etch (e.g., isotropically) away portions of the remaining conductive material layers, forming multiple row lines 210 and channels in one or more sidewalls of the trench. The channels may extend through the space occupied by storage elements 320—before storage elements 320 are formed. The trench and channels may then be filled in with a filling material (e.g., with an insulative material, dielectric material). The filling material may use a different insulative material than the dielectric layers 345.

Vertical openings (which may also be referred to as vias) may be created in portions of the filled-in trench (e.g., over conductive contacts 350). A vertical opening of the vertical openings may be formed in the space occupied by column line 215—before column line 215 is formed. The vertical openings may be used to remove portions of the filling material, forming multiple cavities that are separated (e.g., by the insulative material) from one another in a horizontal, vertical, and inward/outward direction. The cavities may be formed in the space occupied by storage elements 320—before storage elements 320 are formed.

The cavities may be then be filled (e.g., from an inside out) via the vertical opening. In some examples, a chalcogenide material may be used to fill the multiple cavities (forming storage elements 320), and a conductive material may be used to fill the vertical openings that remains after the cavities are filled (forming column line 215). In some examples, instead of filling the multiple cavities with the chalcogenide material, a conductive material may be deposited into the multiple cavities (forming second electrodes 330), then the chalcogenide material may be deposited into the multiple cavities (forming storage elements 320), and next another conductive material may be used to fill a remainder of the cavity (forming first electrodes 325). In some examples, second electrodes 330 may be in contact with row lines 210, and first electrodes 325 may be in contact with column lines 215.

Thus, a process used to form a vertical memory array may result in a vertical stack of groups of horizontally-disposed memory cells that are separated (e.g., isolated) from one another by an insulative material (e.g., a dielectric material). As described herein, a horizontally-disposed memory cell may include a second electrode 330, a storage element 320, and a first electrode 325. In some examples, the horizontally-disposed memory cell may be an example of a self-selecting memory cell. A self-selecting memory cell may be programmed to have a high threshold voltage state or a low threshold voltage state, and measures may not be taken to isolate self-selecting memory cells from voltages applied to other, electrically-coupled memory cells.

Larger cells may be associated with larger programming and leakage currents (e.g., four times the programming current and leakage current may be associated with a cell that is four times larger than another cell). Thus, processes for forming horizontally-disposed memory cells with smaller dimensions may be desired. However, filling a cavity from the inside out to form a horizontally-disposed memory cell may raise challenges when forming memory cells with smaller dimensions—e.g., with a diameter in the 20 nanometer range. In some examples, processes for creating vertical openings for accessing the cavities that are aligned with the cavities may be subject to photolithographic processes and tight tolerances. Moreover, as a size of the memory cell (and thus the cavity) is reduced, a proper alignment of the vertical openings and cavities may be more difficult to obtain. Accordingly, a process for forming a vertical memory array that involves filling a cavity from an inside out to form a memory cell may be limited to larger memory cell sizes. Additionally, filling a cavity from the inside out may involve the formation of an electrode after the formation of the storage element. To avoid damage to the storage element, low temperatures may be desired to form the electrode, which may be infeasible or may hinder the formation of the electrode.

To simplify a process for forming memory cells in a vertical array and to enable the formation of smaller memory cells, a formation process that involves exposing and filling the cavities from a lateral side (rather than from an inside out) may be established. In some examples, the established formation process may include an operation for depositing, via a trench, one or more placeholder materials for the components of the memory cell into channels formed by the material layers. The formation process may also include an operation for forming a vertical opening that exposes a lateral side of the one or more placeholder materials. The vertical opening may be used to replace a portion of the one or more placeholder materials with a material for a corresponding component of the memory cell (e.g., an electrode or storage element). In some examples, the formation process may replace a subset of the one or more placeholder materials with materials associated with electrodes before replacing a placeholder material of the one or more placeholder materials with a material associated with a storage element (which may be referred to as an "electrode first" filling process).

By creating a vertical opening that exposes a lateral side of the placeholder materials, a larger opening may be used and an operation for aligning the vertical opening with a cavity may be avoided. Also, by exposing the lateral side of the placeholder materials, the placeholder materials associated with the electrode may be replaced before the placeholder material associated with a storage element (enabling the electrodes to be formed 20) using higher temperatures and without damaging the storage element).

Figure 4A:
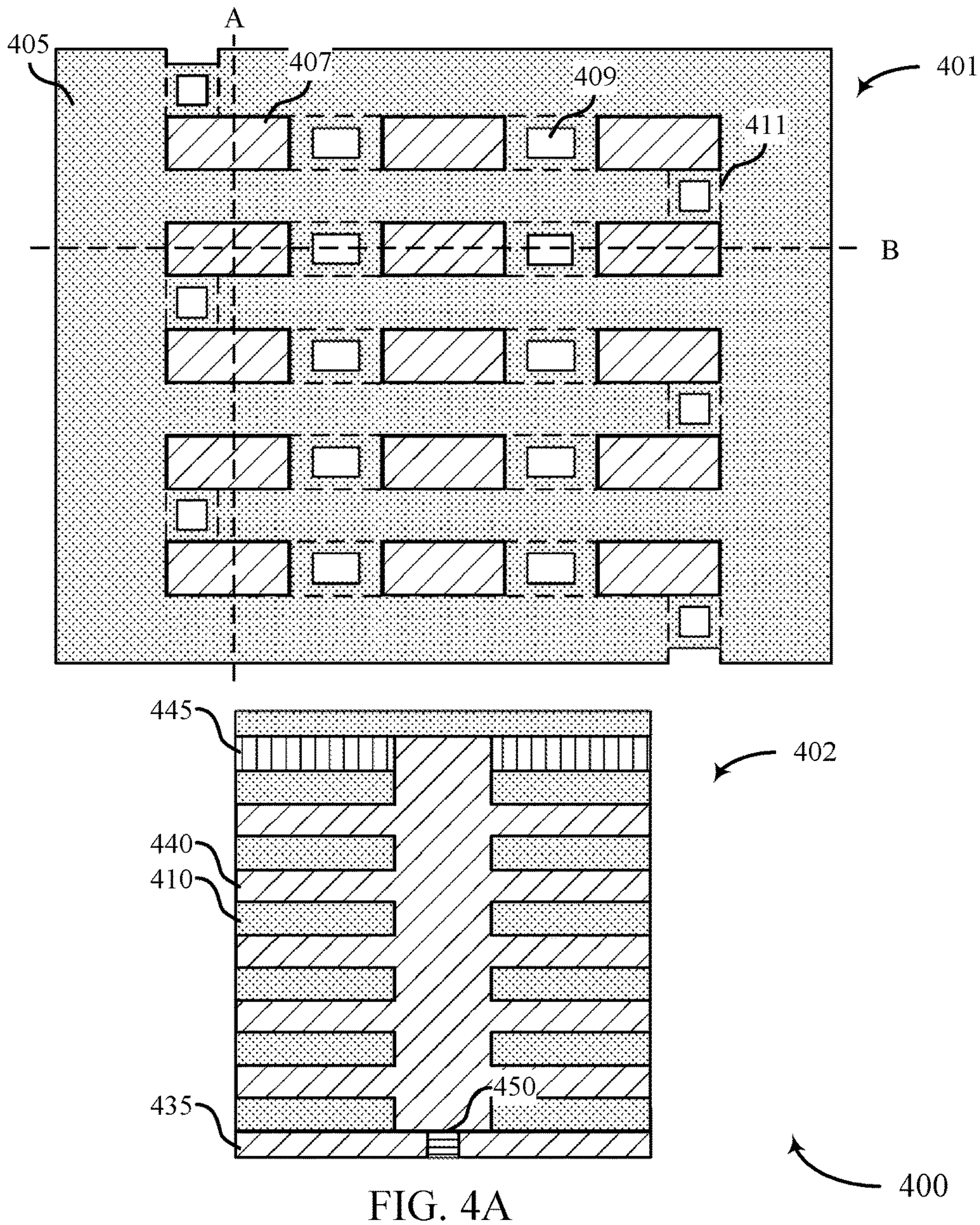
FIGS. 4A and 4B illustrate multiple views of a material structure associated with laterally formed memory cells in accordance with examples as disclosed herein.
Figure 4B:
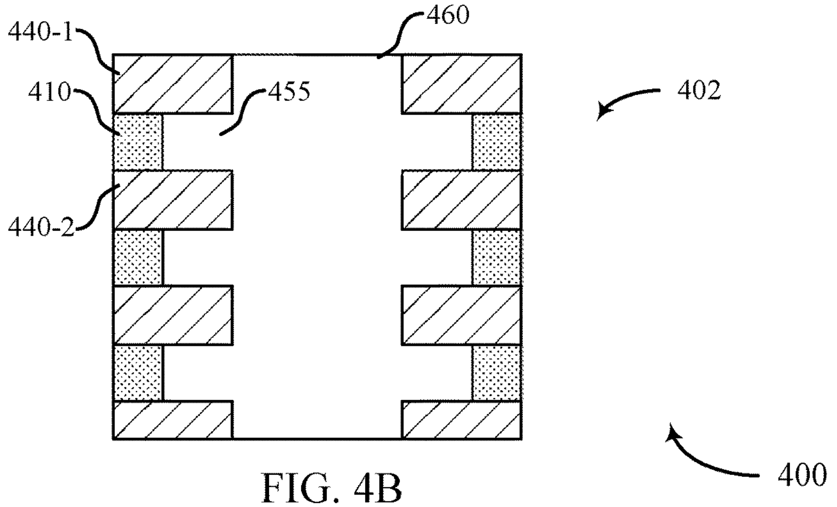

FIGS. 4A and 4B illustrate multiple views of a material structure associated with laterally formed memory cells in accordance with examples as disclosed herein. First perspective 401 depicts a top view of material structure 400 used to form a memory array (e.g., memory array 300 of FIGS. 3A and 3B). Second perspective 402 depicts a cross-sectional view of material structure 400 obtained by omitting (e.g., cutting)material structure 400 from a top of material structure 400 to a bottom of material structure 400 along line B, looking at the exposed section in the direction of line A. The dashed lines 411 running along dielectric material 407 and openings 409 in a serpentine fashion may represent a previously formed trench.

Material structure 400 may include conductive material 405, dielectric material 407 and openings 409. In some examples, conductive material 405 may be a conductive material (e.g., tungsten) used to form word lines. Also, dielectric material 407 may be an insulative material (e.g., silicon oxide) and may be used as a placeholder for subsequent openings that may be used to form memory cells. Openings 409 may be vertical openings that extend from a top of material structure 400 to substrate 435 at a bottom of material structure 400. Material structure 400 may also include a second substrate 445 at a top of material structure 400. In some examples, openings 409 may be used to form conductive layers (e.g., conductive layer 410) throughout material structure 400. In some examples, the conductive layers may correspond to word lines. Dielectric layers (e.g. dielectric layer 440) may also be formed when the conductive layers are formed. In some examples, a conductive contact 450 may be embedded in a substrate 435 at a bottom of the cross-section shown in second perspective 402.

FIG. 4B illustrates a same cross-sectional view of material structure 400 as second perspective 402 after a portion of the dielectric material 407 and a portion of the conductive layers are removed. In some examples, one or more operations (e.g., wet etching, dry etching, photolithography) may be used to remove the pillar of dielectric material 407, exposing the dielectric and conductive layers. After exposing the dielectric and conductive layers, the opening 460 may be used to pull back the conductive layers (e.g., conductive layer 410) from the dielectric layers (e.g., first dielectric layer 440-1) such that an edge of the conductive layers is offset from the dielectric layers (e.g., by between 20 and 40 nanometers). In some examples, a conductive layer, along with multiple dielectric layers, forms a channel that extends through material structure 400 in a direction that extends from a front of material structure 400 to a back of material structure 400 (e.g., into the page). For example, conductive layer 410, first dielectric layer 440-1, and second dielectric layer 440-2 may form channel 455.

Figure 5:
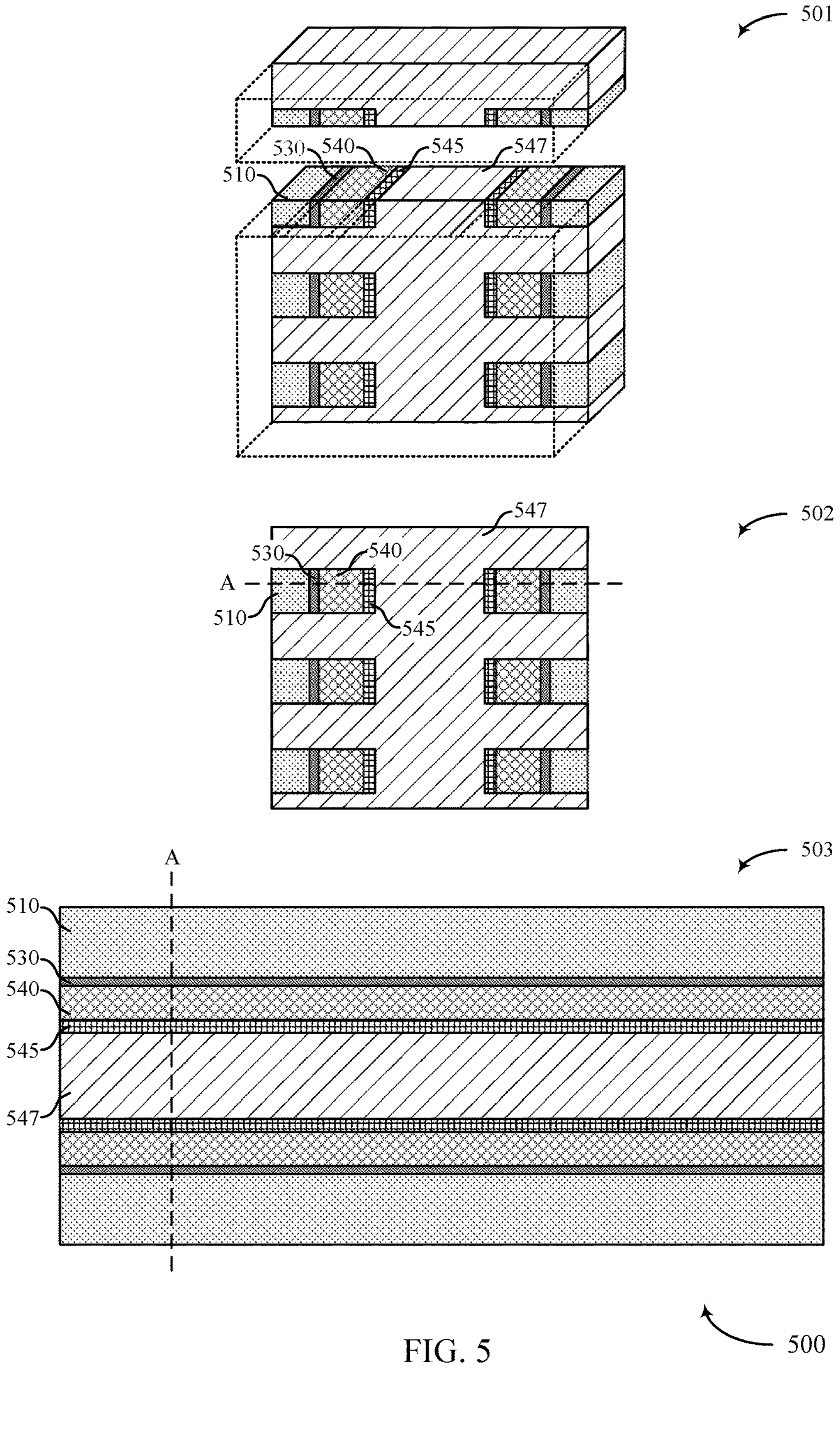
FIG. 5 illustrates multiple views of a material structure associated with laterally formed memory cells in accordance with examples as disclosed herein.

FIG. 5 illustrates multiple views of a material structure associated with laterally formed memory cells in accordance with examples as disclosed herein. First perspective 501 depicts a three-dimensional view of material structure 500 with exposed cross-sections obtained by omitting (e.g., cutting) material structure 500 from a top of material structure 500 to a bottom of material structure 500 and from a front of material structure 500 to a back of material structure 500. Second perspective 502 depicts a cross-sectional view of material structure 500 obtained by omitting (e.g., cutting) material structure 500 from a top of material structure 500) to a bottom of material structure 500 and looking at the exposed cross-section from a front of material structure 500. Third perspective 503 depicts another cross-sectional view of material structure 500 obtained by omitting (e.g., cutting) material structure 500 from a front of material structure 500 to a back of material structure 500 and looking at the exposed cross-section from a top of material structure 500.

The cross-section of third perspective 503 may correspond to the dashed line through the cross-section of second perspective 502, and the cross-section of second perspective 502 may correspond to the dashed line through the cross-section of third perspective 503. In some examples, material structure 500 may be used to form a memory array and may be an example of a material structure, as described with reference to FIG. 4A or 4B.

In some examples, one or more channels (e.g., channel 455 of FIG. 4B) in material structure 500 may be filled with one or more materials via an opening (e.g., opening 460 of FIG. 4B), which may also be a trench. In some examples, first material 530 may be formed in (e.g., on a back wall of) the one or more channels. First material 530 may fill an interior portion of the channel, covering an exposed surface of one or more word lines 510. In some examples, first material 530 is a conductive material (e.g., carbon) and is associated with forming (or forms) a first electrode (e.g., a bottom electrode). In some examples, forming first material 530 in the channel includes depositing a large amount of the first material into the opening such that the channel is completely filled with the first material and the sides of the opening are covered with the first material.

Next, a portion of the first material may be removed such that the remaining portion of the first material corresponds to first material 530 within the channel. In some examples, first material 530 may extend from a front of material structure 500 to a back of material structure 500, as shown in first perspective 501 and third perspective 503. Also, a first side of first material 530 may be exposed to the opening after first material 530 is formed. In some examples, the temperature associated with forming first material 530 is about 400 degrees Celsius. In some examples, a thickness of first material 530 (extending away from word line 510) may be between 2 and 5 nanometers.

After forming first material 530 in the channel, second material 540 may be formed in the channel (e.g., on first material 530). Second material 540 may fill an interior portion of the channel, covering an exposed surface of first material 530. In some examples, second material 540 is a sacrificial (or placeholder) material (e.g., silicon nitride) and is associated with forming a storage element. In some examples, second material 540 is an insulative material. In some examples, forming second material 540 in the channel includes depositing a large amount of the second material into the opening such that the remaining portion of the channel is completely filled with the second material and the sides of the opening are covered with the second material.

Next, a portion of the second material may be removed such that the remaining portion of the second material corresponds to second material 540 within the channel. In some examples, second material 540 may extend from a front of material structure 500 to a back of material structure 500, as shown in first perspective 501 and third perspective 503. Also, the first side of first material 530 may be covered and a first side of second material 540 may be exposed to the opening after second material 540 is formed. In some examples, a thickness of second material 540 (extending away from word line 510) may be between 15 and 25 nanometers.

After forming second material 540 in the channel, third material 545 may be formed in the channel (e.g., on second material 540). Third material 545 may fill an interior portion of the channel, covering an exposed surface of second material 540. In some examples, third material 545 is a sacrificial (or placeholder) material (e.g., aluminum oxide) and is associated with forming a second electrode (e.g., a top electrode). In some examples, third material 545 is an insulative material. In some examples, forming third material 545 in the channel includes depositing a large amount of the third material into the opening such that the remaining portion of the channel is completely filled with the third material and the sides of the opening are covered with the third material.

Next, a portion of the third material may be removed such that the remaining portion of the third material corresponds to third material 545 within the channel. In some examples, third material 545 may extend from a front of material structure 500 to a back of material structure 500, as shown in first perspective 501 and third perspective 503. Also, the first side of second material 540 may be covered and a first side of third material 545 may be exposed to the opening after third material 545 is formed. In some examples, a thickness of third material 545 (extending away from word line 510) may be between 5 and 10 nanometers.

After forming third material 545 in the channel, the opening (or trench) used to access the channel may be filled with dielectric material 547. Accordingly, the first side of third material 545 may be covered by dielectric material 547. In some examples, dielectric material 547 is or includes an oxide material.

Figure 6:
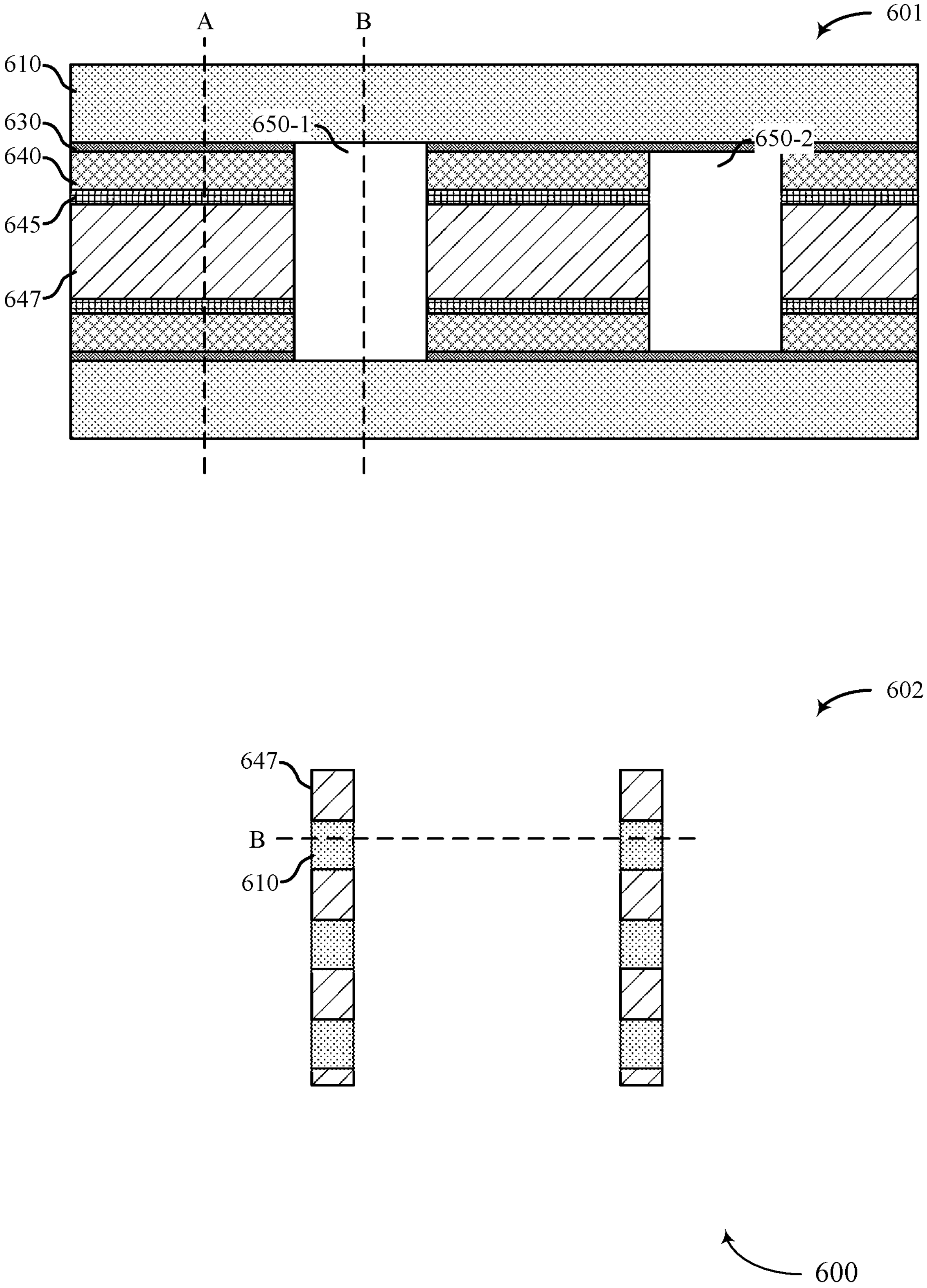
FIG. 6 illustrates multiple views of a material structure associated with laterally formed memory cells in accordance with examples as disclosed herein.

FIG. 6 illustrates multiple views of a material structure associated with laterally formed memory cells in accordance with examples as disclosed herein. First perspective 601 depicts a cross-sectional view of material structure 600 obtained by omitting (e.g., cutting)material structure 600 from a front of material structure 600 to a back of material structure 600 and looking at the exposed cross-section from a top of material structure 600. Second perspective 602 depicts another cross-sectional view of material structure 600 obtained by omitting (e.g., cutting)material structure 600 from a top of material structure 600 to a bottom of material structure 600 and looking at the exposed cross-section from a front of material structure 600.

The cross-section of first perspective 601 may correspond to the dashed line (labeled as B) through the cross-section of second perspective 602, and the cross-section of second perspective 602 may correspond to the dashed line (labeled as B) through the cross-section of first perspective 601. Also, the cross-section of second perspective 502 of FIG. 5 may correspond to the dashed line (labeled as A) through the cross-section of first perspective 601.

In some examples, material structure 600 may be used to form a memory array and may be an example of a material structure, as described with reference to FIGS. 4 and 5. Material structure 600 may include word line 610, first material 630, second material 640, third material 645, and dielectric material 647. After forming the structure depicted in FIG. 5, one or more openings 650 may be formed in material structure 600. The openings 650 may extend from a top of material structure 600 to a bottom of material structure 600 (e.g., to a substrate). Also, the openings may expose second sides of one or more of first material 630, second material 640, and third material 645. In some examples, the second sides may be referred to as lateral sides.

In some examples, first material 630 is a conductive material and forms a bottom electrode. In some examples, an opening is formed that exposes a second side of first material 630, a second side of second material 640, and a second side of third material 645 (e.g., first opening 650-1). In such examples, first material 630 may be broken across material structure 600, forming multiple electrodes (e.g., bottom electrodes) that each contact respective sets of one or more storage elements. In other examples, an opening is formed that exposes a second side of second material 640 and a second side of third material 645 (e.g., second opening 650-2). In such examples, first material 630 may extend across material structure 600, forming a single electrode that contacts multiple storage elements.

In some examples, forming an opening 650) may include performing a first etching operation (e.g., a dry etch) that removes dielectric material 647 and a second etching operation (e.g., a wet etch) that removes third material 645 and second material 640). In some examples, the second etching operation is broken into two operations—e.g., a first etching operation (e.g., a wet etch) that removes third material 645 and a second etching operation that removes second material 640. In some examples, forming the opening 650 includes a third etching operation (e.g., a wet etch) that removes first material 630 (e.g., to form first opening 650-1). In such cases, the initial opening may have smaller dimensions than the later opening 650) (e.g., a length of the initial opening may be 25 nanometers smaller).

By exposing the lateral sides of first material 630, second material 640), third material 645, or any combination thereof, a process for forming material structure 600 may be able to form specific cavities for different memory components (instead of one cavity for multiple memory components). Also, the process for forming material structure 600 may be able to form the memory components in a desired order (rather than an order dictated by filling a cavity from an inside out). For example, the process for forming material structure 600 may be configured to form the electrodes before forming the chalcogenide component.

Figure 7:
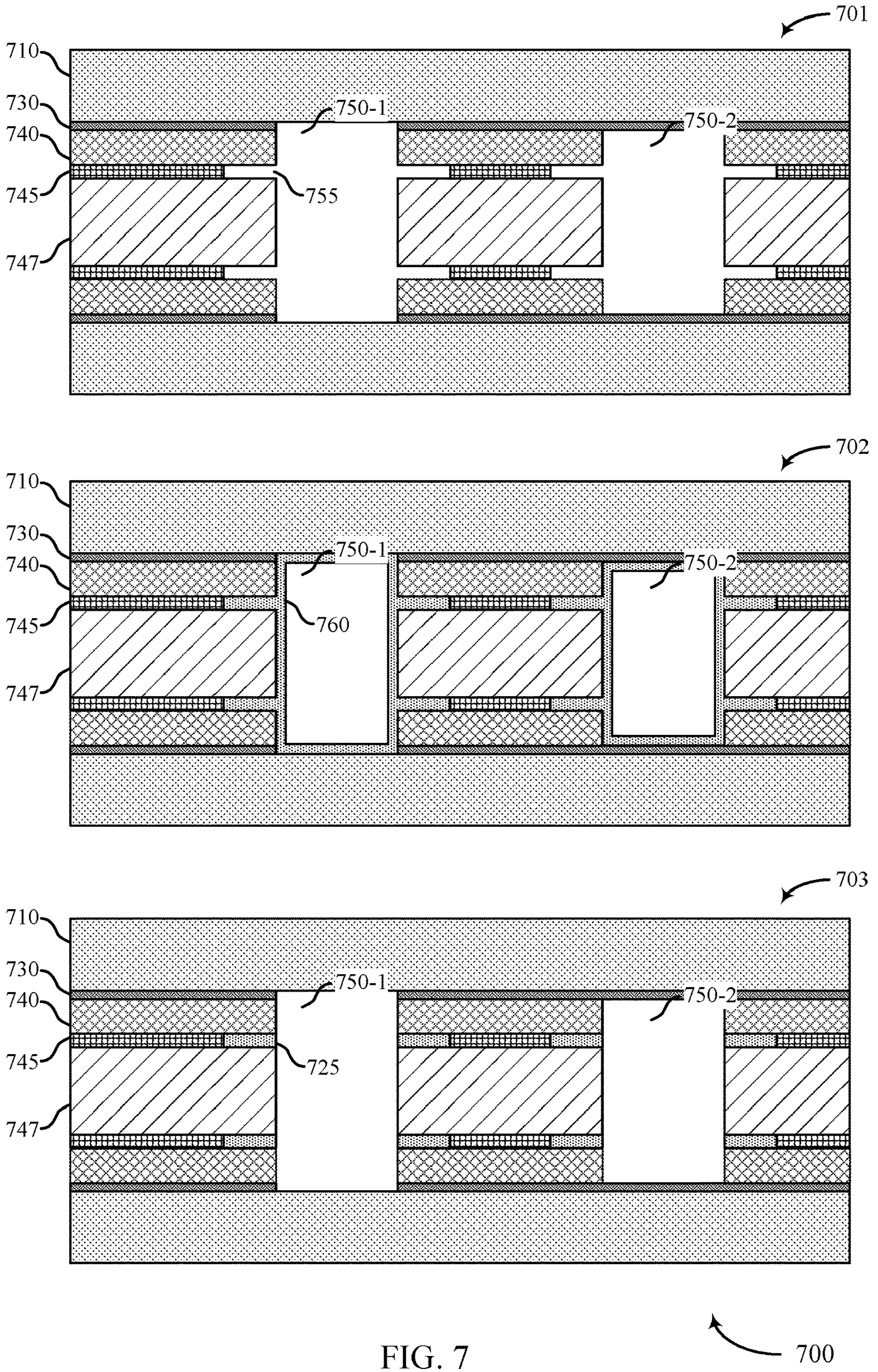
FIG. 7 illustrates different stages of a process for laterally forming electrodes of a material structure in accordance with examples as disclosed herein.

FIG. 7 illustrates different stages of a process for laterally forming electrodes of a material structure in accordance with examples as disclosed herein. First stage 701 shows a stage of a formation process associated with forming cavities (e.g., cavity 755) used to form electrodes (e.g., top electrode 725). Second stage 702 shows a stage of a formation process associated with filling the cavities with a conductive material. Third stage 703 shows a stage of a formation process associated with removing excess portions of the conductive material to obtain a set of electrodes (e.g., top electrode 725).

In some examples, material structure 700 may be used to form a memory array and may be an example of a material structure, as described with reference to FIGS. 4 through 6. Material structure 700 may include word line 710, bottom electrode 730, second material 740, third material 745, and dielectric material 747. Material structure 700 may also include openings 750 formed during a prior stage of the formation process.

In some examples, openings 750-1 may be used to form cavities (e.g., cavity 755) in third material 745. In some examples, openings 750-1 may be used to perform an etching process that removes a portion of third material 745, such that an edge of third material 745 is offset from an edge of second material 740) and dielectric material 747. In some examples, in addition to the cavities shown in first stage 701, multiple cavities are formed in a vertical direction and separated by dielectric material 747. In some examples, forming the cavities includes performing a wet etching operation to remove a portion of third material 745 (e.g., removing about 20 nanometers of third material 745).

After the cavities are formed, conductive material 760 may be deposited within the openings 750 and cavities 755. Conductive material 760 may include carbon. In some examples, conductive material 760 fills the cavities and excess of conductive material 760 is deposited on the sidewalls of the openings 750. In some examples, the temperature associated with depositing conductive material 760 is about 400 degrees Celsius (e.g., because a storage element has not yet been formed). After depositing conductive material 760, a portion of conductive material 760 on the sidewalls of the openings 750 may be removed (e.g., using wet or dry etching techniques) so that separate portions of conductive material 760 may be formed. The separate portions of conductive material 760 may correspond to top electrodes 725. In some examples, a portion of conductive material 760 that contacts word line 710 may be left so that bottom electrode 730 extends across material structure 700.

In some examples, a temperature associated with depositing conductive material 760 to form top electrodes 725 may be higher than other formation processes that involve depositing conductive material 760 after a storage element is formed (e.g., because the effect of the temperature may primarily affect sacrificial second material 740)).

Figure 8:
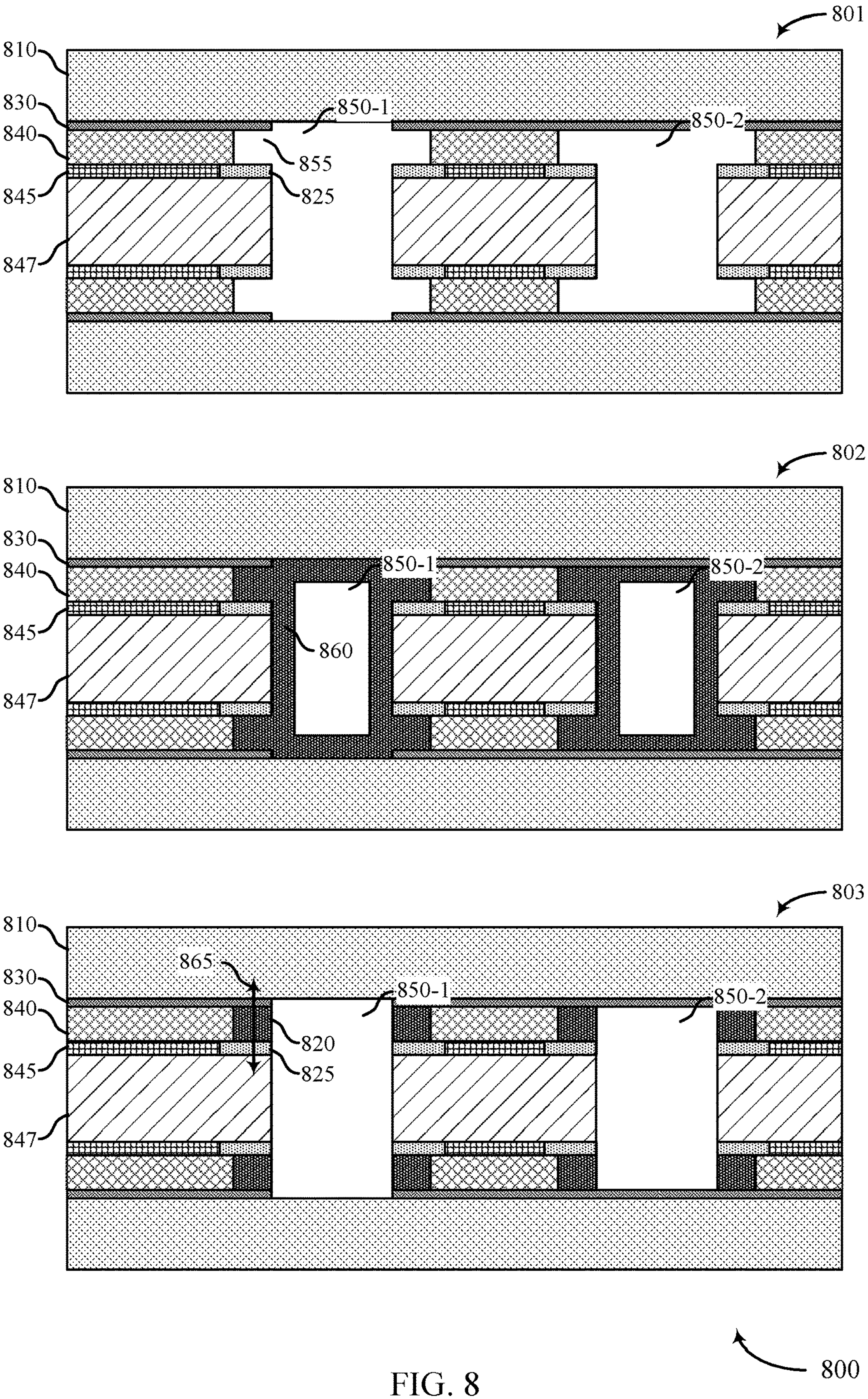
FIG. 8 illustrates different stages of a process for laterally forming storage elements of a material structure in accordance with examples as disclosed herein.

FIG. 8 illustrates different stages of a process for laterally forming storage elements of a material structure in accordance with examples as disclosed herein. First stage 801 shows a stage of a formation process associated with forming cavities (e.g., cavity 855) associated with forming storage elements (e.g., storage element 820). Second stage 802 shows a stage of a formation process associated with filling the cavities with a chalcogenide material. Third stage 803 shows a stage of a formation process associated with removing excess portions of the conductive material to obtain a set of storage elements (e.g., storage element 820).

In some examples, material structure 800 may be used to form a memory array and may be an example of a material structure, as described with reference to FIGS. 4 through 7. Material structure 800 may include word line 810, bottom electrode 830, second material 840, third material 845, dielectric material 847, and top electrode 825. Material structure 800 may also include openings 850 formed during a prior stage of the formation process.

In some examples, openings 850-1 may be used to form cavities (e.g., cavity 855) in second material 840. In some examples, openings 850-1 may be used to perform an etching process that removes a portion of second material 840, such that an edge of second material 840 is offset from an edge of bottom electrode 830 and top electrode 825. In some examples, in addition to the cavities created in first stage 801, multiple cavities are formed in a vertical direction and separated by dielectric material 847. In some examples, forming the cavities includes performing a wet etching operation to remove a portion of second material 840 (e.g., removing about 20 nanometers of second material 840).

After the cavities are formed, chalcogenide material 860 may be deposited within the openings 850 and cavities 855. In some examples, chalcogenide material 860 fills the cavities and excess of chalcogenide material 860 is deposited on the sidewalls of the openings 850. In some examples, a width of the excess portion of chalcogenide material 860 may be about 10 to 15 nanometers—e.g., to ensure that the cavities are filled.

In some examples, before depositing chalcogenide material 860, a protective material (e.g., an aluminum oxide material) may be deposited inside of cavities 855 or a nitridation process may be formed to harden an exposed surface of second material 840, top electrode 825, bottom electrode 830, or any combination thereof. In such cases, a protective liner may exist at least partially if not fully around storage elements 820 after storage elements 820 are formed.

A portion of chalcogenide material 860 on the sidewalls of the openings 850 may be removed (e.g., using wet etching techniques) so that separate portions of chalcogenide material 860 may be formed. In some examples, an inactive sidewall portion of chalcogenide material 860 is exposed to the wet etching. The separate portions of chalcogenide material 860 may correspond to storage elements 820. In some examples, conductive path 865 extends from bottom electrode 830 to top electrode 825 through storage element 820. In some examples, conductive paths 865 through storage elements 820 may extend along axes that do not intersect with openings 850. In some examples, edges of the storage elements are offset from an edge of the bottom and top electrodes. For example, the rightmost edge of storage element 820 may be offset from the rightmost edges of bottom electrode 830 and top electrode 825 in a leftward direction.

By using a lateral filling process to form storage elements 820, a cell size may be more precisely controlled than other formation processes that involve depositing a chalcogenide material directly into a cavity. That is, for the lateral filling process, the front and back of the cavity 855 may be precisely controlled by the bottom electrode layer and the top electrode layer, and the depth of cavity 855 may be precisely controlled by an etching process. Also, unlike other formation processes, the opening used to form cavity 855 need not be precisely aligned with an existing cavity.

Figure 9:
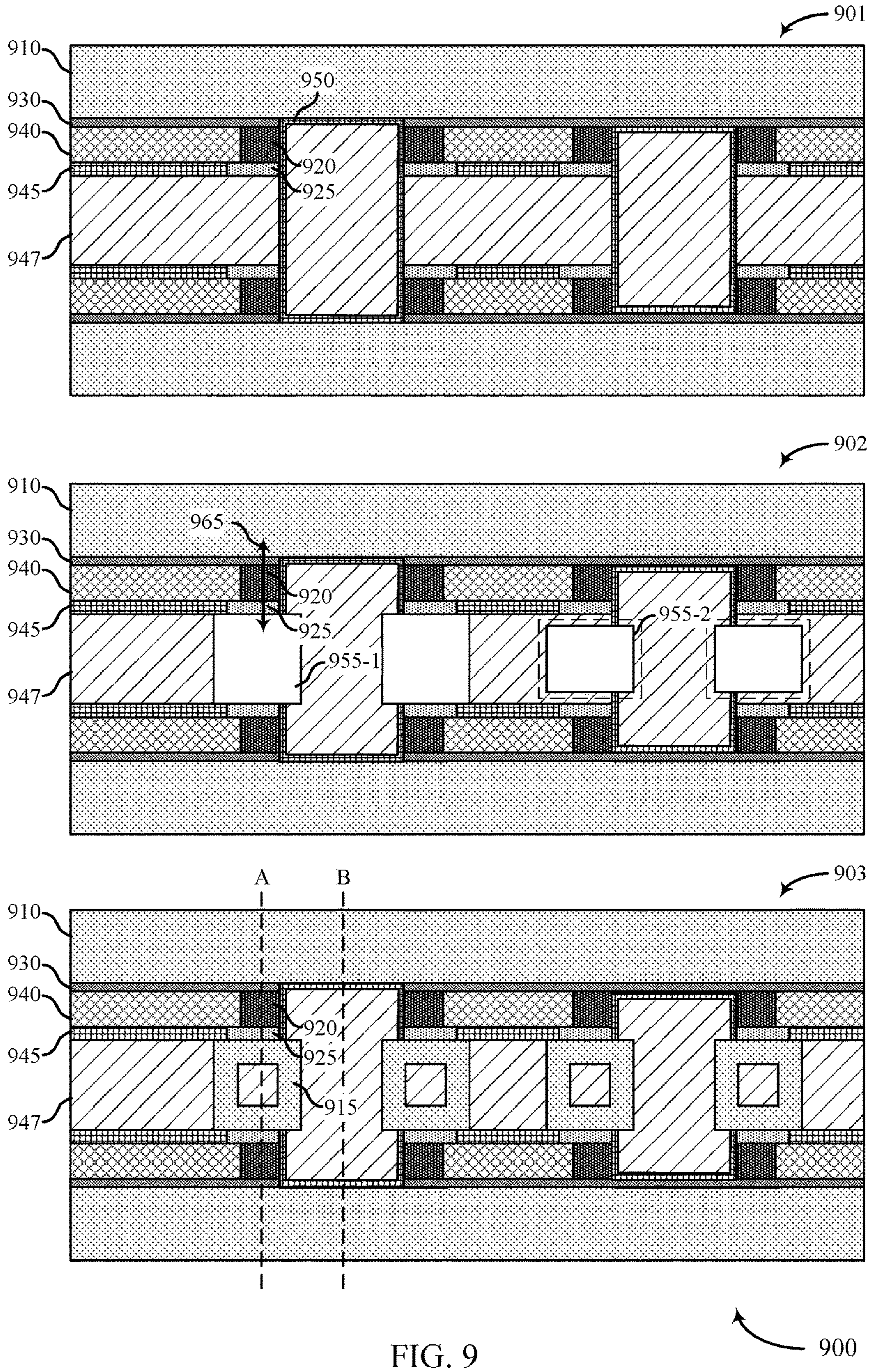
FIG. 9 illustrates different stages of a process for laterally forming electrodes of a material structure in accordance with examples as disclosed herein.

FIG. 9 illustrates different stages of a process for laterally forming electrodes of a material structure in accordance with examples as disclosed herein. First stage 901 shows a stage of a formation process associated with filling the openings used to from the storage elements (e.g., storage element 920) and top electrodes (e.g., top electrode 925). Second stage 902 shows a stage of a formation process associated with forming second openings used to form bit lines (e.g., bit line 915). Third stage 903 shows a stage of a formation process associated with forming bit lines in the second openings (e.g., bit line 915).

In some examples, material structure 900 may be used to form a memory array and may be an example of a material structure, as described with reference to FIGS. 4 through 8. Material structure 900 may include word line 910, bottom electrode 930, second material 940, third material 945, dielectric material 947, and top electrode 925.

In some examples, openings used to form storage element 920 and top electrode 925 (e.g., openings 750) or openings 850 of FIGS. 7 and 8) may be filled (e.g., with dielectric material 947. In some examples, the openings may be filled with a different dielectric material than dielectric material 947. In some examples, prior to filling the openings, a protective material (e.g., an aluminum oxide material, a silicon nitride material, etc.) may be deposited on the interior sidewalls of the openings to form protective liner 950. Protective liner 950 may isolate the bottom electrodes, storage elements, top electrodes, or any combination thereof, from the dielectric material used to fill the openings.

After filling the openings, second openings may be formed in-line with the bottom electrode 930, storage element 920, and top electrode 925. In some examples, conductive paths 965 through storage elements 920 may extend along axes that pass through second openings 955. In some examples, the second openings (e.g., second opening 955-2) may be formed using a first etching operation (e.g., a dry etching operation) to form a first portion of the second openings and a second etching operation (e.g., a wet etching operation) to form a second portion of the second openings that exposes the top electrodes 925—e.g., to decrease incidental etching/erosion of the top electrode. In such cases, the storage elements may not be exposed to the wet etch operation (instead the top electrodes may be exposed to the wet etch operation).

Second openings 955 may be filled with a conductive material (e.g., tungsten) to form bit lines (e.g., bit line 915). In some examples, the bit lines are hollow and an interior portion of second opening 955 is filled with a dielectric material (e.g., dielectric material 947). Accordingly, memory cells and conductors for accessing memory cells may be formed. In some examples, material structure 900 may be an example of a cross-section of a memory array (e.g., memory array 300 of FIGS. 3A and 3B).

FIG. 10 illustrates multiple views of a material structure associated with laterally formed memory cells in accordance with examples as disclosed herein. First perspective 1001 depicts a cross-sectional view of material structure 1000 (which may correspond to material structure 900 at third stage 903 of FIG. 9) obtained by omitting (e.g., cutting) material structure 1000 from a top of material structure 1000 to a bottom of material structure 1000 at a location that corresponds to the dashed line (labeled as B and with reference to FIG. 9). Second perspective 1002 depicts another cross-sectional view of material structure 1000 obtained by omitting (e.g., cutting)material structure 1000 from a top of material structure 1000 to a bottom of material structure 1000 at a location that corresponds to the dashed line (labeled as A and with reference to FIG. 9).

In first perspective 1001, alternating layers of dielectric material 1047 and word lines 1010 extend from a bottom to a top of material structure 1000. Also, a protective material 1050 may separate the dielectric material 1047 and word lines 1010 from the dielectric material (which may be the same as dielectric material 1047) used to fill the opening between opposing word lines.

In second perspective 1002, alternating layers of dielectric material 1047 and horizontally-disposed memory cells may extend from a bottom to a top of material structure 1000. Each memory cell may include a bottom electrode (e.g., bottom electrode 1030), a storage element (e.g., storage element 1020), and a top electrode (e.g., top electrode 1025).

The bottom electrode of the memory cells may be in contact with word lines (e.g., word line 1010) and the top electrodes of the memory cells may be in contact with bit lines (e.g., bit line 1015). In some examples, the storage elements may be encapsulated by a protective material—e.g., to prevent reactions between the chalcogenide material of the storage element and dielectric material 1047.

In another example for forming a memory array, a material structure may be formed by filling a channel with only one material (e.g., a placeholder material for a storage element). In such examples, operations associated with exposing a lateral side of the material to form the storage element may still be performed, while operations associated with forming the bottom electrodes, top electrodes, or both may be omitted. For example, first material 530 and third material 545 of FIG. 5 may not be used to fill a channel, and operations associated with first stage 701, second stage 702, and third stage 703 of FIG. 7 may not be performed. Additional options for forming memory arrays are described herein and with reference to FIGS. 11 through 16, among other sections.

Figure 11:
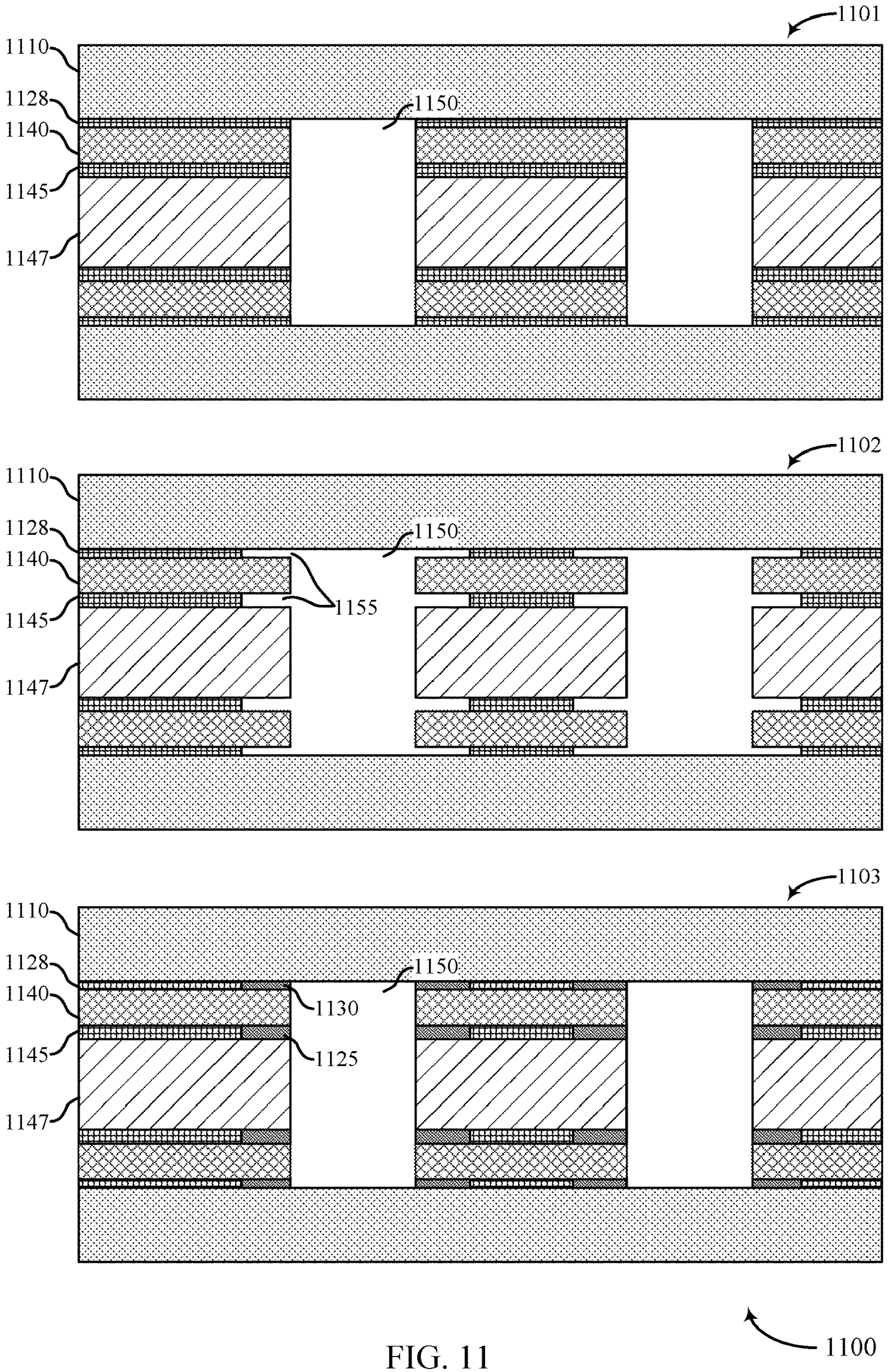
FIG. 11 illustrates different stages of a process for laterally forming electrodes of a material structure in accordance with examples as disclosed herein.

FIG. 11 illustrates different stages of a process for laterally forming electrodes of a material structure in accordance with examples as disclosed herein. First stage 1101 shows a stage of a formation process associated with forming openings in a material structure that includes a first material 1128 as a placeholder for an electrode. That is, by way of comparison with first perspective 601 of FIG. 6, the first material 630 is replaced with first material 1128, where first material 1128 may be a sacrificial material (e.g., an aluminum oxide material).

Second stage 1102 shows a stage of a formation process associated with forming cavities (e.g., cavities 1155) used to form electrodes (e.g., bottom electrode 1130 and top electrode 1125). Third stage 1103 shows a stage of a formation process associated with filling the cavities with a conductive material and removing excess portions of the conductive material to obtain a set of electrodes (e.g., bottom electrode 1130 and top electrode 1125). In some examples, first stage 1101, second stage 1102, and third stage 1103 replace stages in the formation process described herein. For example, first stage 1101 may replace first stage 701 of FIG. 7, second stage 1102 may replace second stage 702 of FIG. 7, and third stage may replace third stage 703 of FIG. 7.

In some examples, material structure 1100 may be used to form a memory array and may be an example of a material structure, as described with reference to FIG. 4A or 4B. Material structure 1100 may include word line 1110, first material 1128, second material 1140, third material 1145, and dielectric material 1147. Material structure 1100 may also include openings 1150 formed during a prior stage of the formation process.

In some examples, openings 1150 may be used to form cavities (e.g., cavities 1155) in first material 1128 and third material 1145, as similarly described with reference to FIG. 7. In some examples, openings 1150 may be used to perform an etching process (e.g., an isotropic etching process) that removes a portion of first material 1128 and a portion of third material 1145, such that an edge of first material 1128 and an edge of third material 1145 are offset from an edge of second material 1140 and dielectric material 1147. In some examples, in addition to the cavities shown in first stage 1101, multiple cavities are formed in a vertical direction and separated by dielectric material 1147.

After the cavities are formed, a conductive material (e.g., a carbon material) may be deposited within the openings 1150 and cavities 1155, as similarly described with reference to second stage 702 of FIG. 7. In some examples, the conductive material fills the cavities and excess of the conductive material is deposited on the sidewalls of the openings 1150. A portion of the conductive material on the sidewalls of the openings 1150 may be removed (e.g., using wet or dry etching techniques) so that separate portions of the conductive material may be formed. The separate portions of the conductive material may correspond to bottom electrodes 1130 and top electrodes 1125. In some examples, a portion of the conductive material that contacts word line 1110 may be left so that bottom electrode 1130 extends between multiple memory cells. In some examples, after third stage 1103 is completed, the formation process proceeds to first stage 801 of FIG. 8 to form the storage elements.

Figure 12:
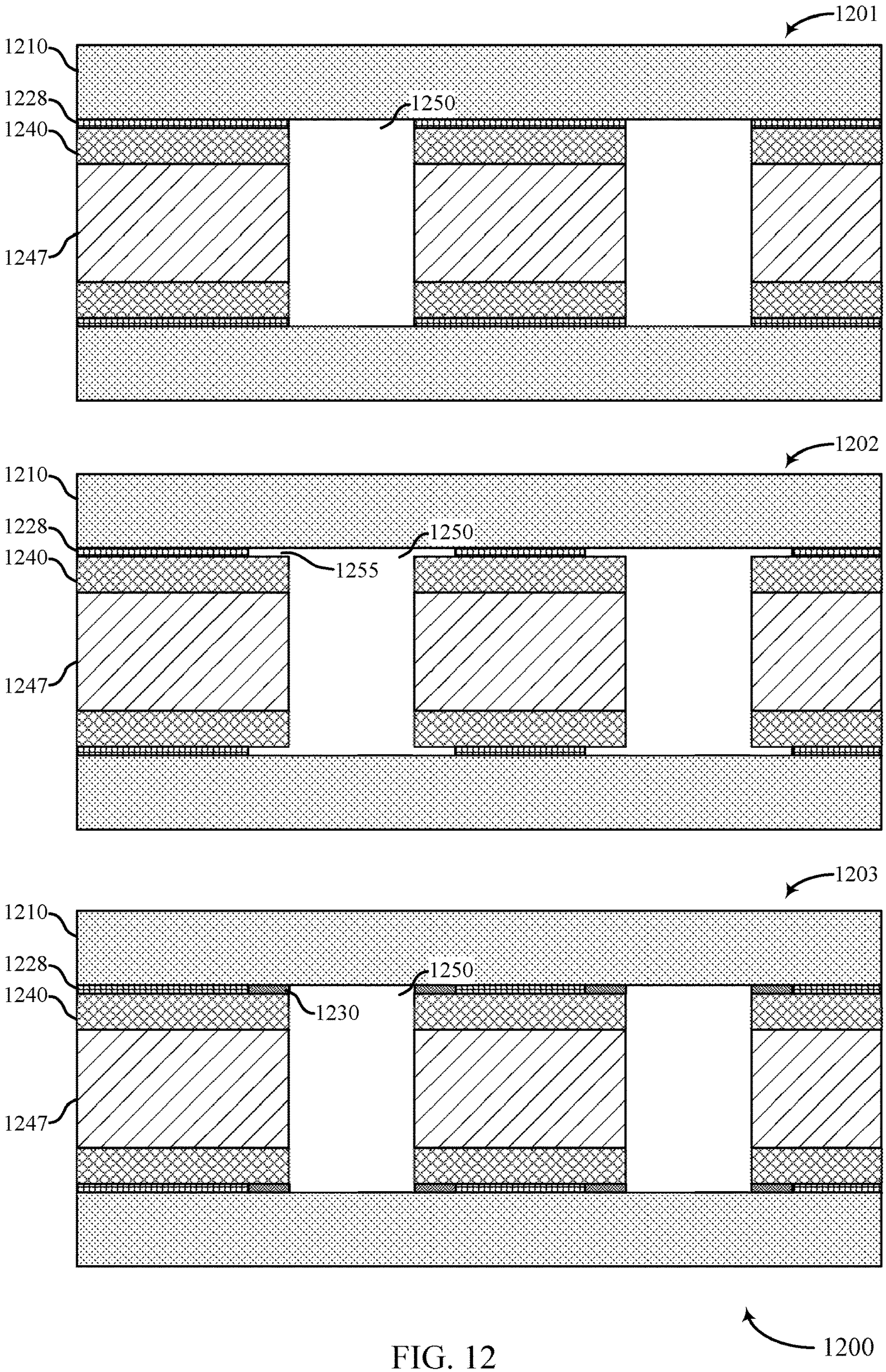
FIG. 12 illustrates different stages of a process for laterally forming electrodes of a material structure in accordance with examples as disclosed herein.

FIG. 12 illustrates different stages of a process for laterally forming electrodes of a material structure in accordance with examples as disclosed herein. First stage 1201 shows a stage of a formation process associated with forming openings in a material structure that includes a first material 1228 as a placeholder for a first electrode (e.g., a bottom electrode) and does not include a placeholder material for a second electrode (e.g., a top electrode). That is, by way of comparison with first perspective 601 of FIG. 6, the first material 630 is replaced with first material 1228, where first material 1228 may be a sacrificial material (e.g., an aluminum oxide material). And the third material 645 is not deposited.

Second stage 1202 shows a stage of a formation process associated with forming cavities (e.g., cavities 1255) used to form electrodes (e.g., bottom electrode 1230). Third stage 1203 shows a stage of a formation process associated with filling the cavities with a conductive material and removing excess portions of the conductive material to obtain a set of electrodes (e.g., bottom electrode 1230). In some examples, first stage 1201, second stage 1202, and third stage 1203 replace stages in the formation process described herein. For example, first stage 1201 may replace first stage 701 of FIG. 7, second stage 1202 may replace second stage 702 of FIG. 7, and third stage may replace third stage 703 of FIG. 7.

In some examples, material structure 1200 may be used to form a memory array and may be an example of a material structure, as described with reference to FIG. 4A or 4B. Material structure 1200 may include word line 1210, first material 1228, second material 1240, and dielectric material 1247. Material structure 1200 may also include openings 1250 formed during a prior stage of the formation process.

In some examples, openings 1250 may be used to form cavities (e.g., cavities 1255) in first material 1228, as similarly described with reference to FIG. 7. In some examples, openings 1250 may be used to perform an etching process (e.g., an isotropic etching process) that removes a portion of first material 1228, such that an edge of first material 1228 is offset from an edge of second material 1240 and dielectric material 1247. In some examples, in addition to the cavities shown in first stage 1201, multiple cavities are formed in a vertical direction and separated by dielectric material 1247.

After the cavities are formed, a conductive material (e.g., a carbon material) may be deposited within the openings 1250 and cavities 1255, as similarly described with reference to second stage 702 of FIG. 7. In some examples, the conductive material fills the cavities and excess of the conductive material is deposited on the sidewalls of the openings 1250. A portion of the conductive material on the sidewalls of the openings 1250 may be removed (e.g., using wet or dry etching techniques) so that separate portions of the conductive material may be formed. The separate portions of the conductive material may correspond to bottom electrodes 1230. In some examples, a portion of the conductive material that contacts word line 1210 may be left so that bottom electrode 1230 extends between multiple memory cells.

Figure 13:
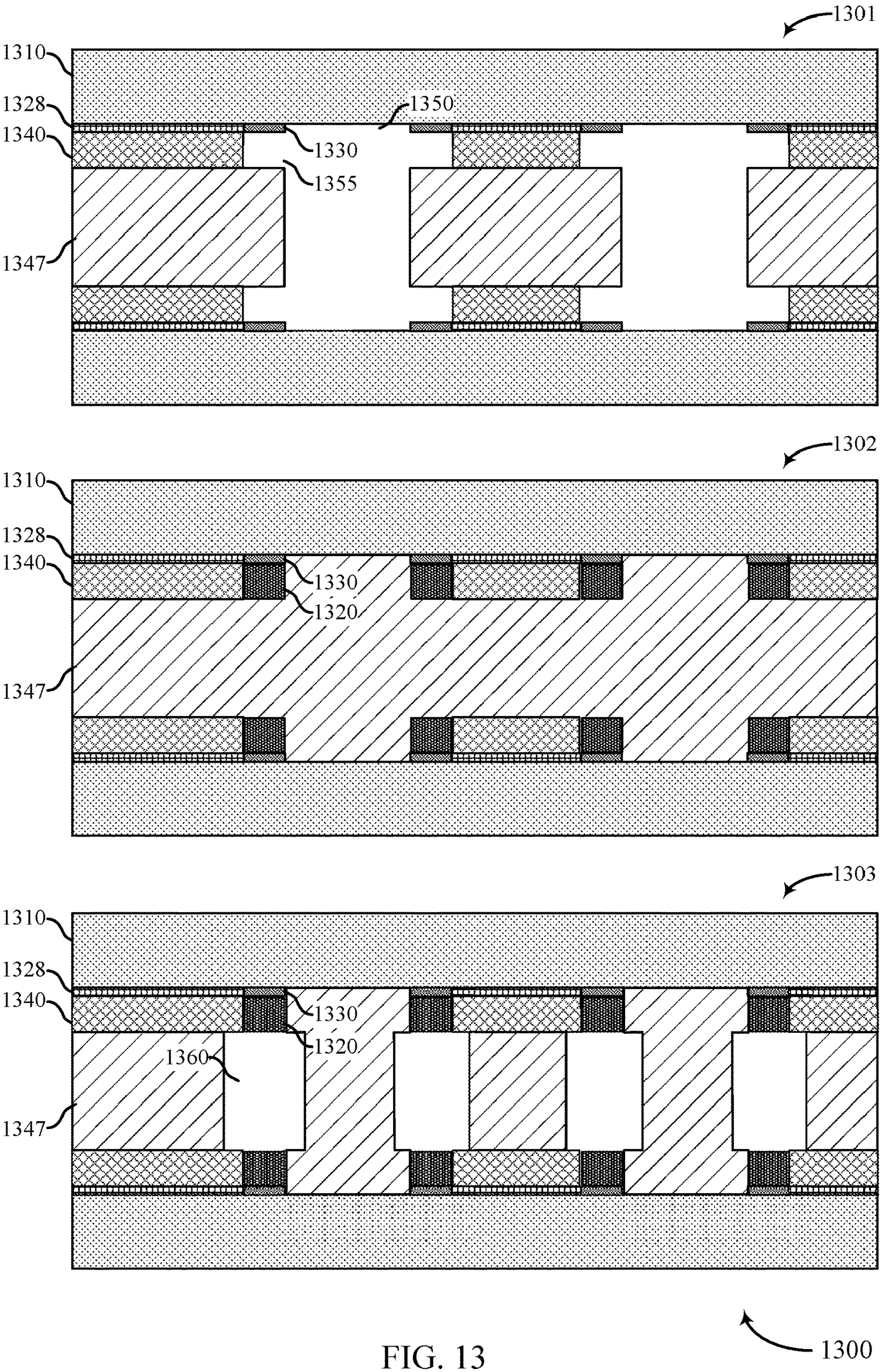
FIG. 13 illustrates different stages of a process for laterally forming storage elements of a material structure in accordance with examples as disclosed herein.

FIG. 13 illustrates different stages of a process for laterally forming storage elements of a material structure in accordance with examples as disclosed herein. First stage 1301 shows a stage of a formation process associated with forming cavities (e.g., cavity 1355) associated with forming storage elements (e.g., storage element 1320). Second stage 1302 shows a stage of a formation process associated with filling the cavities with a chalcogenide material and removing excess portions of the conductive material to obtain a set of storage elements (e.g., storage elements 1320). Third stage 1303 shows a stage of a formation process associated with forming second openings in-line with the bottom electrodes and storage element and used to form top electrodes and bit lines.

In some examples, material structure 1300 may be used to form a memory array and may be an example of a material structure, as described with reference to FIGS. 4 and 12. Material structure 1300 may include word line 1310, first material 1328, bottom electrode 1330, second material 1340, and dielectric material 1347. Material structure 1300 may also include openings 1350 formed during a prior stage of the formation process.

In some examples, openings 1350 may be used to form cavities (e.g., cavity 1355) in second material 1340, as similarly described with reference to FIG. 8. In some examples, openings 1350 may be used to perform an etching process that removes a portion of second material 1340, such that an edge of second material 1340 is offset from an edge of bottom electrode 1330. In some examples, in addition to the cavities created in first stage 1301, multiple cavities are formed in a vertical direction and separated by dielectric material 1347.

After the cavities are formed, a chalcogenide material may be deposited within the openings 1350 and cavities 1355, as similarly described with reference to FIG. 8. In some examples, the chalcogenide material fills the cavities and excess of the chalcogenide material is deposited on the sidewalls of the openings 1350. In some examples, before depositing the chalcogenide material, a protective material (e.g., an aluminum oxide material) may be deposited inside of cavities 1355 or a nitridation process may be formed to harden an exposed surface of second material 1340, bottom electrode 1330, or both. In such cases, a protective liner may exist at least partially if not fully around storage elements 1320 after storage elements 1320 are formed.

A portion of the chalcogenide material on the sidewalls of the openings 1350 may be removed (e.g., using wet or dry etching techniques) so that separate portions of the chalcogenide material may be formed. The separate portions of the chalcogenide material may correspond to storage elements 1320. In some examples, edges of the storage elements are offset from an edge of the bottom electrode. For example, the rightmost edge of storage element 1320 may be offset from the rightmost edge of bottom electrode 1330 in a leftward direction.

After forming the storage elements, openings 1350 may be filled in with a dielectric material (e.g., the same dielectric material as dielectric material 1347). In some examples, an aluminum oxide liner may be deposited on the sidewalls of openings 1350 before filling the openings 1350.

After forming the storage element and filling openings 1350, second openings (e.g., second opening 1360) may be formed in line with bottom electrodes (e.g., bottom electrode 1330) and storage elements (e.g., storage element 1320). In some examples, second opening 1360 may expose a surface of storage element 1320. In some examples, forming second openings includes forming a smaller portion of the second openings 1360 using a first etching process (e.g., a dry etch) and forming the full second openings 1360 using a second etching process (e.g., a wet etch) to softly expose the surface of the storage element 1320.

Figure 14A:
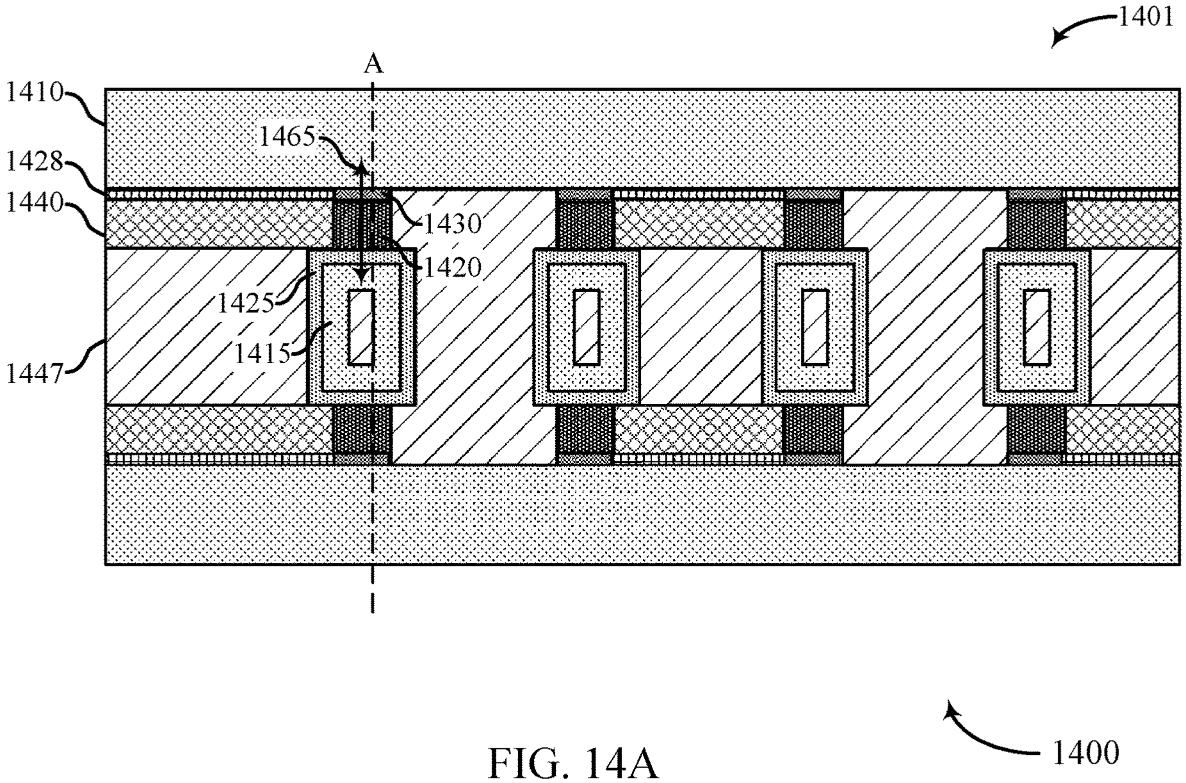
FIG. 14A illustrates different stages of a process for laterally forming electrodes of a material structure in accordance with examples as disclosed herein.

FIG. 14A illustrates different stages of a process for laterally forming electrodes of a material structure in accordance with examples as disclosed herein. Stage 1401 shows a stage of a formation process associated with forming top electrodes (e.g., top electrode 1425) and bit lines (e.g., bit line 1415).

In some examples, material structure 1400 may be used to form a memory array and may be an example of a material structure, as described with reference to FIGS. 4, 12, and 13. Material structure 1400 may include word line 1410, first material 1428, bottom electrode 1430, second material 1440, and dielectric material 1447. Material structure 1400 may also include openings (e.g., second openings 1360 of FIG. 13) formed during a prior stage of the formation process.

In some examples, the second openings may be filled with a conductive material (e.g., carbon) to form top electrodes (e.g., top electrode 1425) and another conductive material (e.g., tungsten) to form bit lines (e.g., bit line 1415). In some examples, the top electrodes may extend at least partially if not fully around a first portion of the second openings and may encircle the bit lines. In some examples, the bit lines may be hollow and filled with a dielectric material (e.g., the same material as dielectric material 1447). In some examples, the conductive material used to form the top electrode may be deposited at a temperature that is about 200 degrees Celsius. In some examples, material structure 1400 may be an example of a cross-section of a memory array (e.g., memory array 300 of FIGS. 3A and 3B).

Figure 14B:
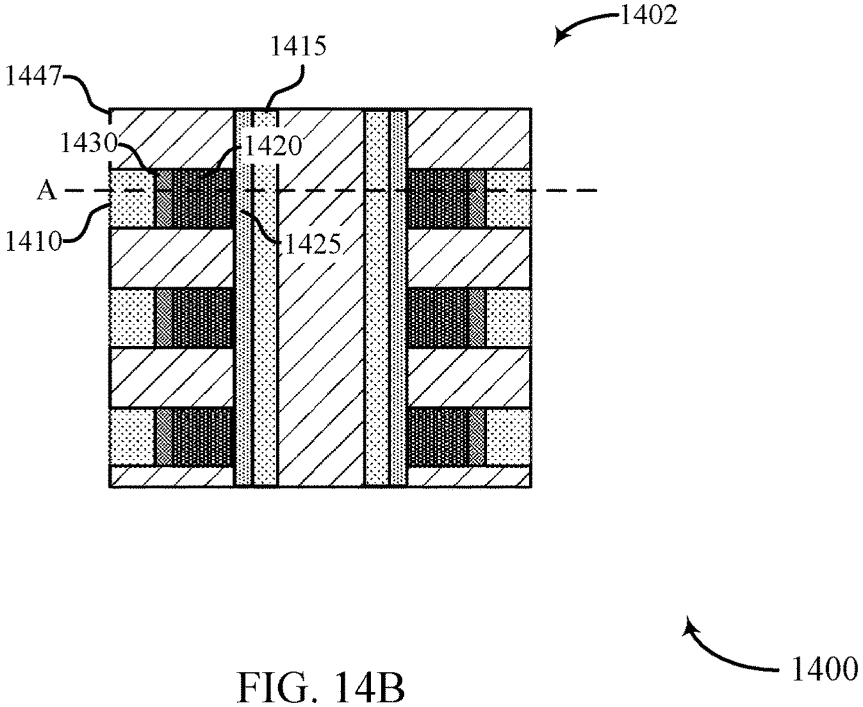
FIG. 14B illustrates multiple views of a material structure associated with laterally formed memory cells in accordance with examples as disclosed herein.

FIG. 14B illustrates multiple views of a material structure associated with laterally formed memory cells in accordance with examples as disclosed herein. Perspective 1402 depicts a cross-sectional view of material structure 1400 as shown in stage 1401 of FIG. 14A obtained by omitting (e.g., cutting)material structure 1400 from a top of material structure 1400 to a bottom of material structure 1400 at a location that corresponds to the dashed line (labeled as A).

In perspective 1402, alternating layers of dielectric material 1447 and horizontally-disposed memory cells may extend from a bottom to a top of material structure 1400. Each memory cell may include a bottom electrode (e.g., bottom electrode 1430), a storage element (e.g., storage element 1420), and a top electrode (e.g., top electrode 1425). The bottom electrode of the memory cells may be in contact with word lines (e.g., word line 1410) and the top electrodes of the memory cells may be in contact with bit lines (e.g., bit line 1415). In some examples, the storage elements may be encapsulated by a protective material—e.g., to prevent reactions between the chalcogenide material of the storage element and dielectric material 1047. As shown in perspective 1402 and by way of comparison with second perspective 1002, the top electrodes in material structure 1400 may extend from a top of material structure 1400 to a bottom of material structure 1400.

Figure 15:
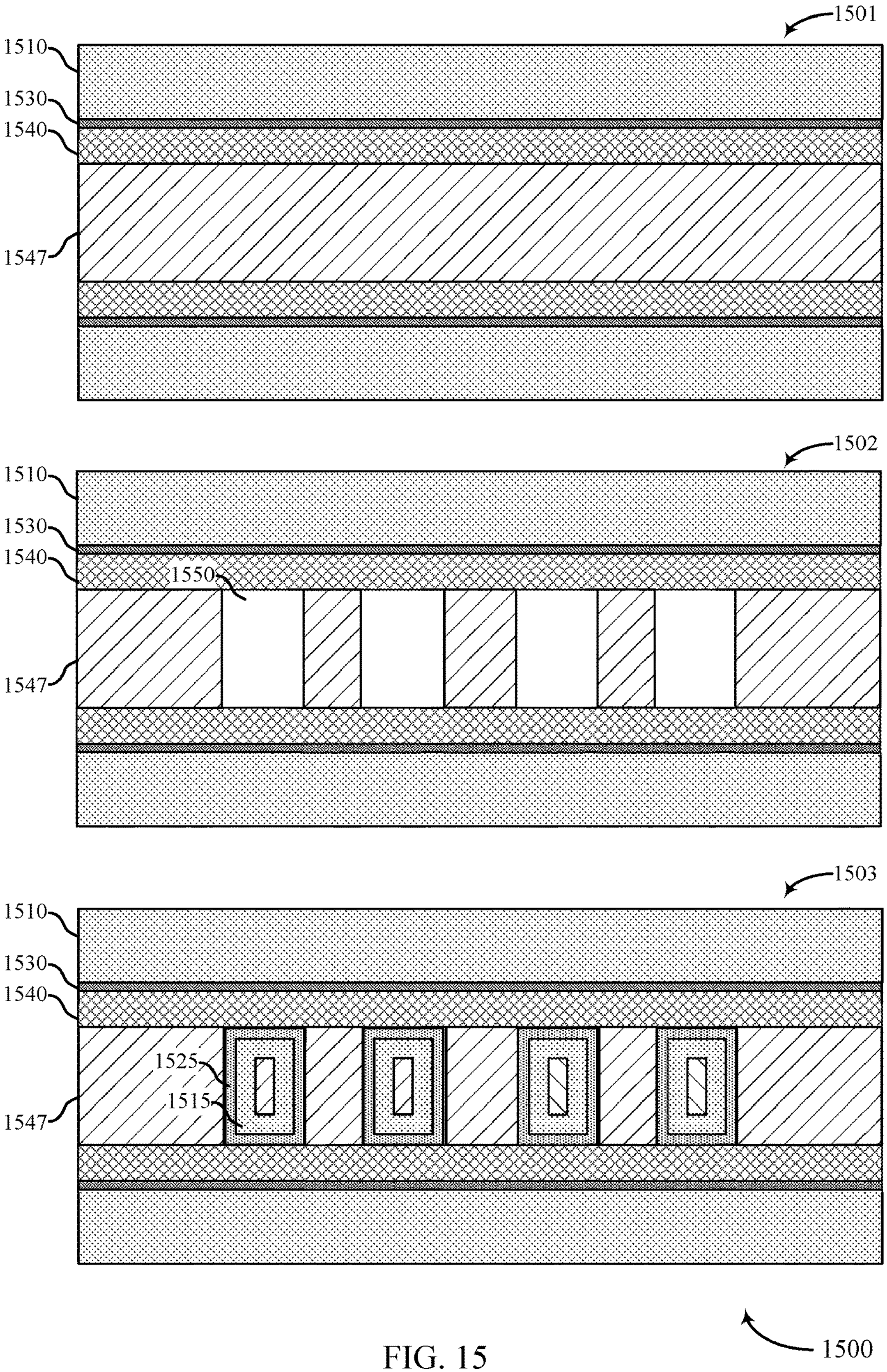
FIG. 15 illustrates different stages of a process for laterally forming electrodes of a material structure in accordance with examples as disclosed herein.

FIG. 15 illustrates different stages of a process for laterally forming electrodes of a material structure in accordance with examples as disclosed herein. First stage 1501 shows a stage of a formation process associated with filling a channel with one or more placeholder materials. Second stage 1502 shows a stage of a formation process associated with forming openings (e.g., opening 1550) in the dielectric material. Third stage 1503 shows a stage of a formation process associated with filling the openings with a conductive material to form top electrodes (e.g., top electrode 1525) and another conductive material to form bit lines (e.g., bit line 1515).

In some examples, material structure 1500 may be used to form a memory array and may be an example of a material structure, as described with reference to FIG. 4A or 4B. Material structure 1500 may include word line 1510, bottom electrode 1530, second material 1540, and dielectric material 1547.

In some examples, openings 1550 may be formed in dielectric material 1547. In some examples openings 1550 are formed using an etching process, photolithographic process, or both. Openings 1550 may then be filled with conductive materials (e.g., carbon and tungsten) to form top electrodes (e.g., top electrode 1525) and bit lines (e.g., bit lines 1515). In some examples, a first conductive material (e.g., carbon) may be deposited on the sidewalls of opening 1550 to from top electrode 1525, and a smaller portion of the openings 1550 may remain empty. In some examples, first conductive material is formed at a temperature that is about 400 degrees Celsius. A second conductive material (e.g., tungsten) may then be deposited on the sidewalls of the remaining portion of the opening 1550 to form bit line 1515. In some examples, an even smaller portion of the openings 1550 may remain empty after the bit lines are formed and filled in with a dielectric material (e.g., using the same material as dielectric material 1547).

Figure 16:
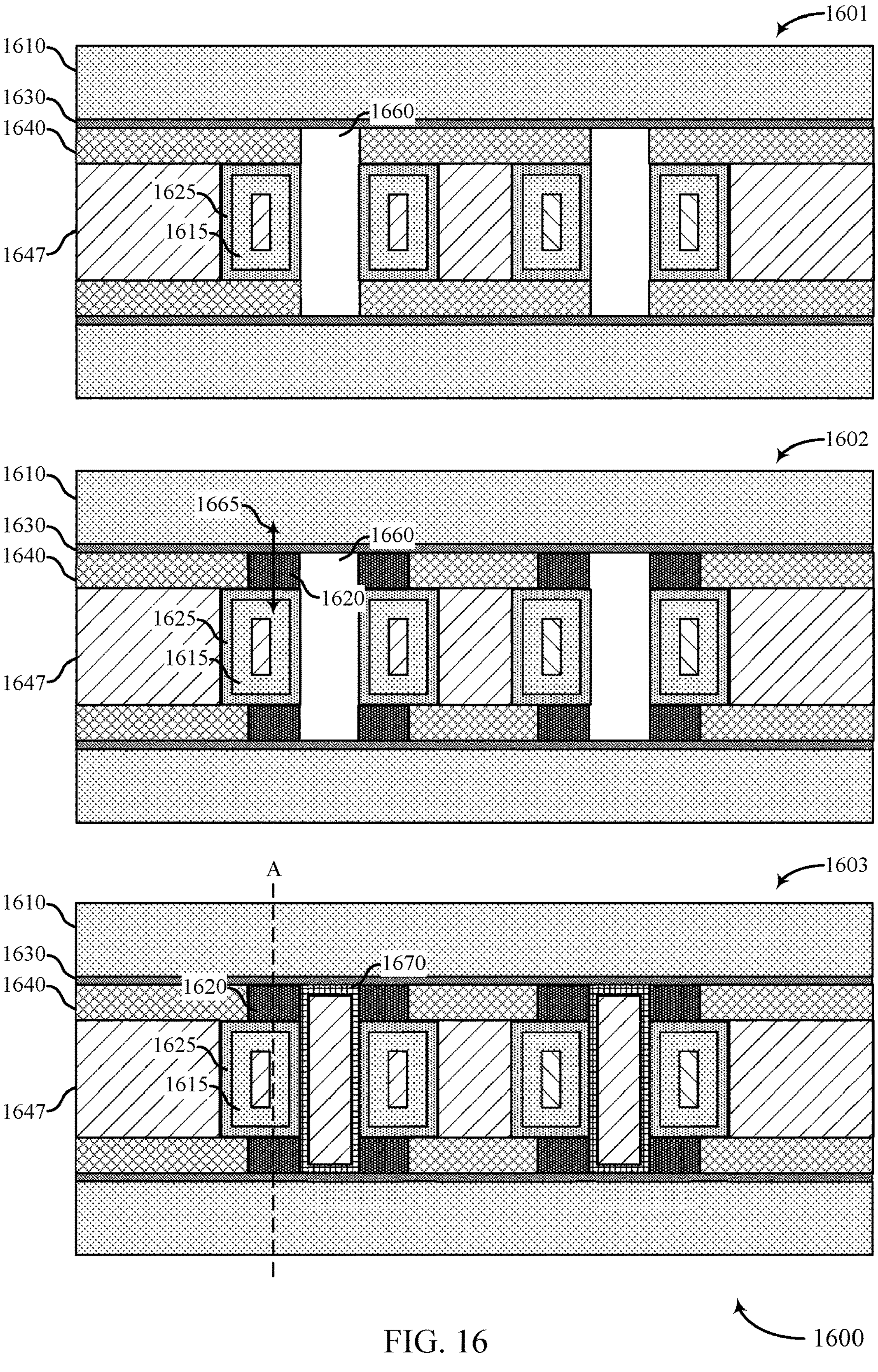
FIG. 16 illustrates different stages of a process for laterally forming storage elements of a material structure in accordance with examples as disclosed herein.

FIG. 16 illustrates different stages of a process for laterally forming storage elements of a material structure in accordance with examples as disclosed herein. First stage 1601 shows a stage of a formation process associated with forming second openings (e.g., second opening 1660) for laterally forming a storage element. Second stage 1602 shows a stage of a formation process associated with filling a cavity with a chalcogenide material to form storage elements (e.g., storage element 1620). Third stage 1603 shows a stage of a formation process associated with filling the second openings.

In some examples, material structure 1600 may be used to form a memory array and may be an example of a material structure, as described with reference to FIGS. 4 and 15. Material structure 1600 may include word line 1610, bottom electrode 1630, second material 1640, dielectric material 1647, top electrode 1625, and bit line 1615.

In some examples, second openings 1660 may be formed along a side of top electrodes and at least through second material 1640 (and in some examples through bottom electrode 1630). Accordingly, second openings 1660 may expose a lateral side of second material 1640.

Second openings 1660 may be used to replace a portion of second material 1640 with a chalcogenide material to form storage elements (e.g., storage element 1620), as similarly described with reference to FIG. 8. In some examples, forming storage element 1620 may include etching away a portion of second material 1640 so that a rightmost edge of the remaining portion of second material 1640 is offset from the rightmost edge of top electrode in a leftward direction, forming a cavity. Forming storage element 1620 may also include depositing the chalcogenide material into the cavity, where an excess portion of the chalcogenide material may be deposited on the sidewalls of second opening 1660. Forming storage element 1620 may additionally include removing the excess portion of the chalcogenide material from the sidewalls of second opening 1660. In some examples, before storage element 1620 is formed, a protective material liner may be formed between storage element 1620 and the exposed surface of second material 1640, bottom electrode 1630 and top electrode 1625, as similarly described herein. In some examples, a conductive path may extend from bottom electrode 1630 to top electrode 1625 and through storage element 1620 in a direction that runs parallel to a side of second opening 1660 that exposes a lateral side of storage element 1620.

After forming storage element 1620, the second openings may be filled in. In some examples, filing in the second openings includes filling the second openings with a dielectric material (e.g., using a same or different material than dielectric material 1657). In some examples, filing in the second openings includes depositing a protective material liner (e.g., protective liner 1670) on the sidewalls of the second openings prior to filling the second openings with the dielectric material—e.g., to avoid reactions between the chalcogenide material of storage element 1620 and the dielectric material.

A cross-section of material structure 1600 obtained by omitting (e.g., cutting) material structure 1600 from a top to bottom may be similar to the cross-section shown by perspective 1402 of FIG. 14B. In some examples, material structure 1600 may be an example of a cross-section of a memory array (e.g., memory array 300 of FIGS. 3A and 3B).

Figure 17:
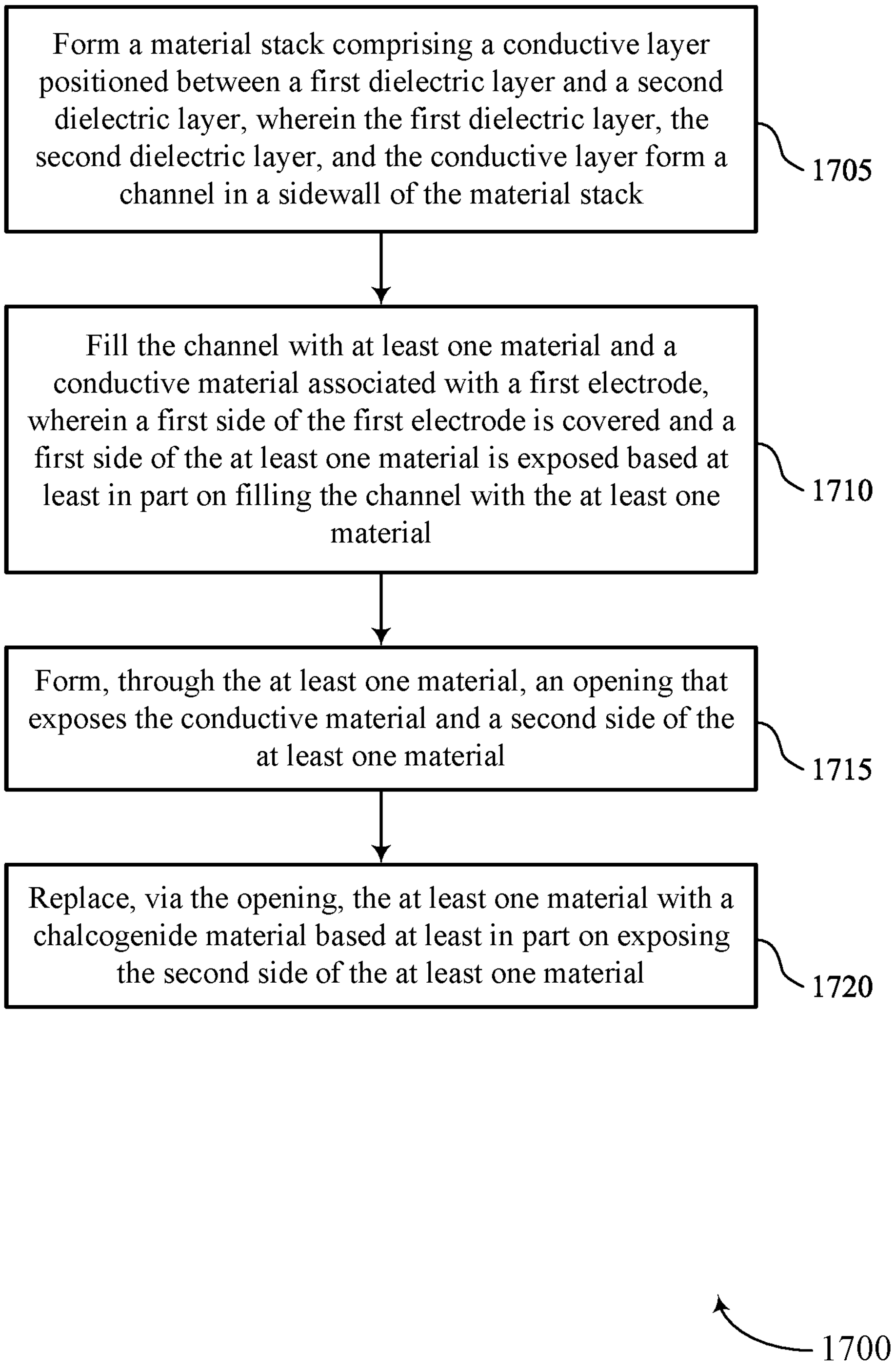
FIGS. 17 through 20 show flowcharts illustrating a method or methods that support a memory device with laterally formed memory cells in accordance with examples as disclosed herein.

FIG. 17 shows a flowchart illustrating a method 1700 that supports a memory device with laterally formed memory cells in accordance with examples as disclosed herein. The operations of method 1700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1705, the method may include forming a material stack including a conductive layer positioned between a first dielectric layer and a second dielectric layer, where the first dielectric layer, the second dielectric layer, and the conductive layer form a channel in a sidewall of the material stack. The operations of 1705 may be performed in accordance with examples as disclosed herein.

At 1710, the method may include filling the channel with at least one material and a conductive material associated with a first electrode, where a first side of the first electrode is covered and a first side of the at least one material is exposed based at least in part on filling the channel with the at least one material. The operations of 1710 may be performed in accordance with examples as disclosed herein.

At 1715, the method may include forming, through the at least one material, an opening that exposes the conductive material and a second side of the at least one material. The operations of 1715 may be performed in accordance with examples as disclosed herein.

At 1720, the method may include replacing, via the opening, the at least one material with a chalcogenide material based at least in part on exposing the second side of the at least one material. The operations of 1720 may be performed in accordance with examples as disclosed herein.

In some examples, an apparatus as described herein may perform a method or methods, such as the method 1700. The apparatus may include, features, circuitry, logic, means, or instructions (e.g., a non-transitory computer-readable medium storing instructions executable by a processor) for forming a material stack including a conductive layer positioned between a first dielectric layer and a second dielectric layer, where the first dielectric layer, the second dielectric layer, and the conductive layer form a channel in a sidewall of the material stack, filling the channel with at least one material and a conductive material associated with a first electrode, where a first side of the first electrode is covered and a first side of the at least one material is exposed based at least in part on filling the channel with the at least one material, forming, through the at least one material, an opening that exposes the conductive material and a second side of the at least one material, and replacing, via the opening, the at least one material with a chalcogenide material based at least in part on exposing the second side of the at least one material.

In some examples of the method 1700 and the apparatus described herein, filling the channel with the at least one material may include operations, features, circuitry, logic, means, or instructions for depositing, into the channel and over the conductive material, a first material associated with a storage element and depositing, into the channel and over a first side of the first material, a second material associated with a second electrode, and where a first side of the first material may be covered and a first side of the second material may be exposed based at least in part on filling the channel with the second material.

In some examples of the method 1700 and the apparatus described herein, forming the opening may include operations, features, circuitry, logic, means, or instructions for forming the opening through the first material and the second material, where a second side of the first material and a second side of the second material may be exposed based at least in part on forming the opening.

In some examples of the method 1700 and the apparatus described herein, the first material includes silicon nitride, and the second material includes aluminum oxide.

In some examples of the method 1700 and the apparatus described herein, a mutual etch selectivity between the first material, the second material, the first dielectric material, and the second dielectric material exceeds a threshold. The mutual etch selectivity may indicate a degree of resistance of one material to a chemical used to etch away another material.

In some examples of the method 1700 and the apparatus described herein, the channel may be filled via a trench and the method, apparatuses, and non-transitory computer-readable medium may include further operations, features, circuitry, logic, means, or instructions for filling the trench with a dielectric material, where the first side of the at least one material may be covered based at least in part on filling the trench, and where the opening may be formed through the dielectric material.

In some examples of the method 1700 and the apparatus described herein, replacing the at least one material may include operations, features, circuitry, logic, means, or instructions for etching, via the opening, a first material of the at least one material and associated with a second electrode to form a cavity and depositing, via the opening, a second conductive material into the cavity to form the second electrode.

In some examples of the method 1700 and the apparatus described herein, replacing the at least one material with the chalcogenide material may include operations, features, circuitry, logic, means, or instructions for etching, via the opening and after forming the second electrode, a second material of the at least one material and associated with a storage element to form a second cavity and depositing, via the opening, the chalcogenide material into the second cavity to form the storage element.

Some examples of the method 1700 and the apparatus described herein may further include operations, features, circuitry, logic, means, or instructions for forming, prior to replacing the at least one material with the chalcogenide material, a liner on an interior of the second cavity that separates the chalcogenide material from the second material of the at least one material, the first electrode, the second electrode, or any combination thereof.

Some examples of the method 1700 and the apparatus described herein may further include operations, features, circuitry, logic, means, or instructions for filling the opening with an aluminum oxide material and a dielectric material based at least in part on replacing the at least one material, where the aluminum oxide material separates the at least one material from the dielectric material.

In some examples of the method 1700 and the apparatus described herein, filling, prior to forming the opening through the at least one material, a trench used to access the channel, where the first side of the at least one material may be covered based at least in part on filling the trench, filling the opening with a dielectric material based at least in part on replacing the at least one material with a second conductive material to form a second electrode and the chalcogenide material to form a storage element, where a first side of the second electrode may be exposed by the opening prior to filling the opening, and forming, after filling the opening with the dielectric material, a second opening that exposes a second side of the second electrode.

Some examples of the method 1700 and the apparatus described herein may further include operations, features, circuitry, logic, means, or instructions for filling the second opening with at least a third conductive material to form a bit line.

In some examples of the method 1700 and the apparatus described herein, the at least one material may be a placeholder for the chalcogenide material used to form a storage element, a placeholder for a second conductive material used to form a second electrode, or both.

In some examples of the method 1700 and the apparatus described herein, the second side of the at least one material extends in a first direction that may be parallel to a second direction of a current path through the chalcogenide material.

Some examples of the method 1700 and the apparatus described herein may further include operations, features, circuitry, logic, means, or instructions for filling a trench used to fill the channel with a dielectric material based at least in part on filling the channel with the at least one material, where the first side of the at least one material may be covered based at least in part on filling the trench, forming, prior to forming the opening that exposes the second side of the at least one material and based at least in part on filling the trench, a second opening that exposes a portion of the first side of the at least one material, and filling, prior to forming the opening, the second opening with a first conductive material associated with a second electrode, a second conductive material associated with a bit line, or both.

Figure 18:
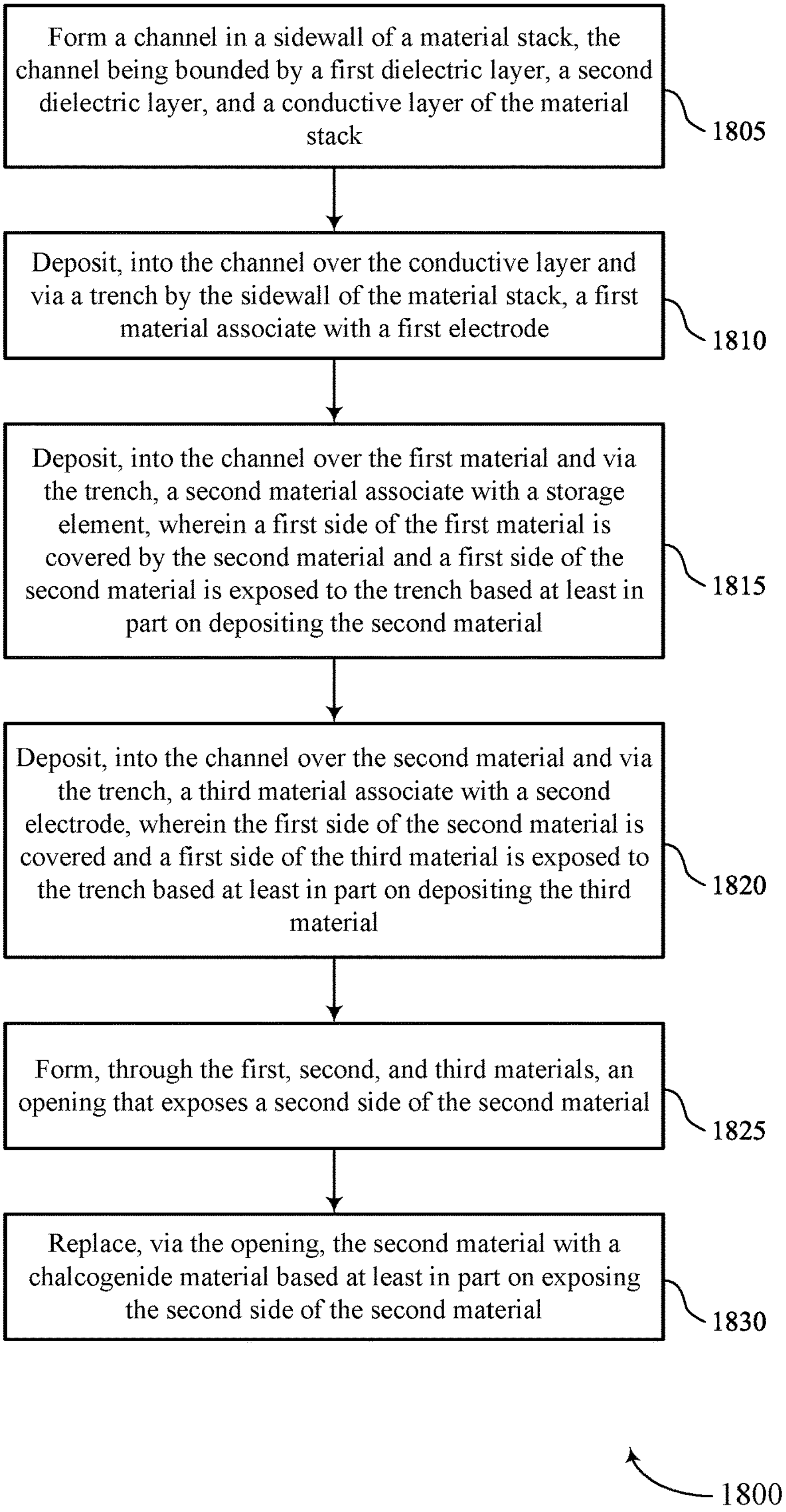

FIG. 18 shows a flowchart illustrating a method 1800 that supports a memory device with laterally formed memory cells in accordance with examples as disclosed herein. The operations of method 1800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1805, the method may include forming a channel in a sidewall of a material stack, the channel being bounded by a first dielectric layer, a second dielectric layer, and a conductive layer of the material stack. The operations of 1805 may be performed in accordance with examples as disclosed herein.

At 1810, the method may include depositing, into the channel over the conductive layer and via a trench by the sidewall of the material stack, a first material associated with a first electrode. The operations of 1810 may be performed in accordance with examples as disclosed herein.

At 1815, the method may include depositing, into the channel over the first material and via the trench, a second material associated with a storage element, where a first side of the first material is covered by the second material and a first side of the second material is exposed to the trench based at least in part on depositing the second material. The operations of 1815 may be performed in accordance with examples as disclosed herein.

At 1820, the method may include depositing, into the channel over the second material and via the trench, a third material associated with a second electrode, where the first side of the second material is covered and a first side of the third material is exposed to the trench based at least in part on depositing the third material. The operations of 1820 may be performed in accordance with examples as disclosed herein.

At 1825, the method may include forming, through the first, second, and third materials, an opening that exposes a second side of the second material. The operations of 1825 may be performed in accordance with examples as disclosed herein.

At 1830, the method may include replacing, via the opening, the second material with a chalcogenide material based at least in part on exposing the second side of the second material. The operations of 1830 may be performed in accordance with examples as disclosed herein.

In some examples, an apparatus as described herein may perform a method or methods, such as the method 1800. The apparatus may include, features, circuitry, logic, means, or instructions (e.g., a non-transitory computer-readable medium storing instructions executable by a processor) for forming a channel in a sidewall of a material stack, the channel being bounded by a first dielectric layer, a second dielectric layer, and a conductive layer of the material stack, depositing, into the channel over the conductive layer and via a trench by the sidewall of the material stack, a first material associated with a first electrode, depositing, into the channel over the first material and via the trench, a second material associated with a storage element, where a first side of the first material is covered by the second material and a first side of the second material is exposed to the trench based at least in part on depositing the second material, depositing, into the channel over the second material and via the trench, a third material associated with a second electrode, where the first side of the second material is covered and a first side of the third material is exposed to the trench based at least in part on depositing the third material, forming, through the first, second, and third materials, an opening that exposes a second side of the second material, and replacing, via the opening, the second material with a chalcogenide material based at least in part on exposing the second side of the second material.

Some examples of the method 1800 and the apparatus described herein may further include operations, features, circuitry, logic, means, or instructions for replacing, via the opening and before replacing the second material, the first material and the third material with a conductive material to form the first electrode and the second electrode.

In some examples of the method 1800 and the apparatus described herein, replacing the first material and the third material with the conductive material may include operations, features, circuitry, logic, means, or instructions for etching, via the opening, a portion of the first material and the third material to form a first cavity associated with the first electrode and a second cavity associated with the second electrode and depositing, via the opening, the conductive material into the first cavity and the second cavity to form the first electrode and the second electrode.

In some examples of the method 1800 and the apparatus described herein, replacing the second material with the chalcogenide material may include operations, features, circuitry, logic, means, or instructions for etching, via the opening and after forming the first electrode and the second electrode, a portion of the second material to form a cavity and depositing, via the opening, the chalcogenide material into the cavity to form the storage element.

Some examples of the method 1800 and the apparatus described herein may further include operations, features, circuitry, logic, means, or instructions for filling the trench with a dielectric material based at least in part on depositing the third material into the channel, where the first side of the third material may be covered based at least in part on filling the trench, and where the opening may be formed through the dielectric material.

In some examples of the method 1800 and the apparatus described herein, the opening exposes a second side of the first material and a second side of the third material.

In some examples of the method 1800 and the apparatus described herein, the first material and the third material include aluminum oxide, and the second material includes silicon nitride.

In some examples of the method 1800 and the apparatus described herein, the first material may be a placeholder for a conductive material used to form the first electrode, the second material may be a placeholder for the chalcogenide material used to form the storage element, and the third material may be a placeholder for a second conductive material used to form the second electrode.

Figure 19:
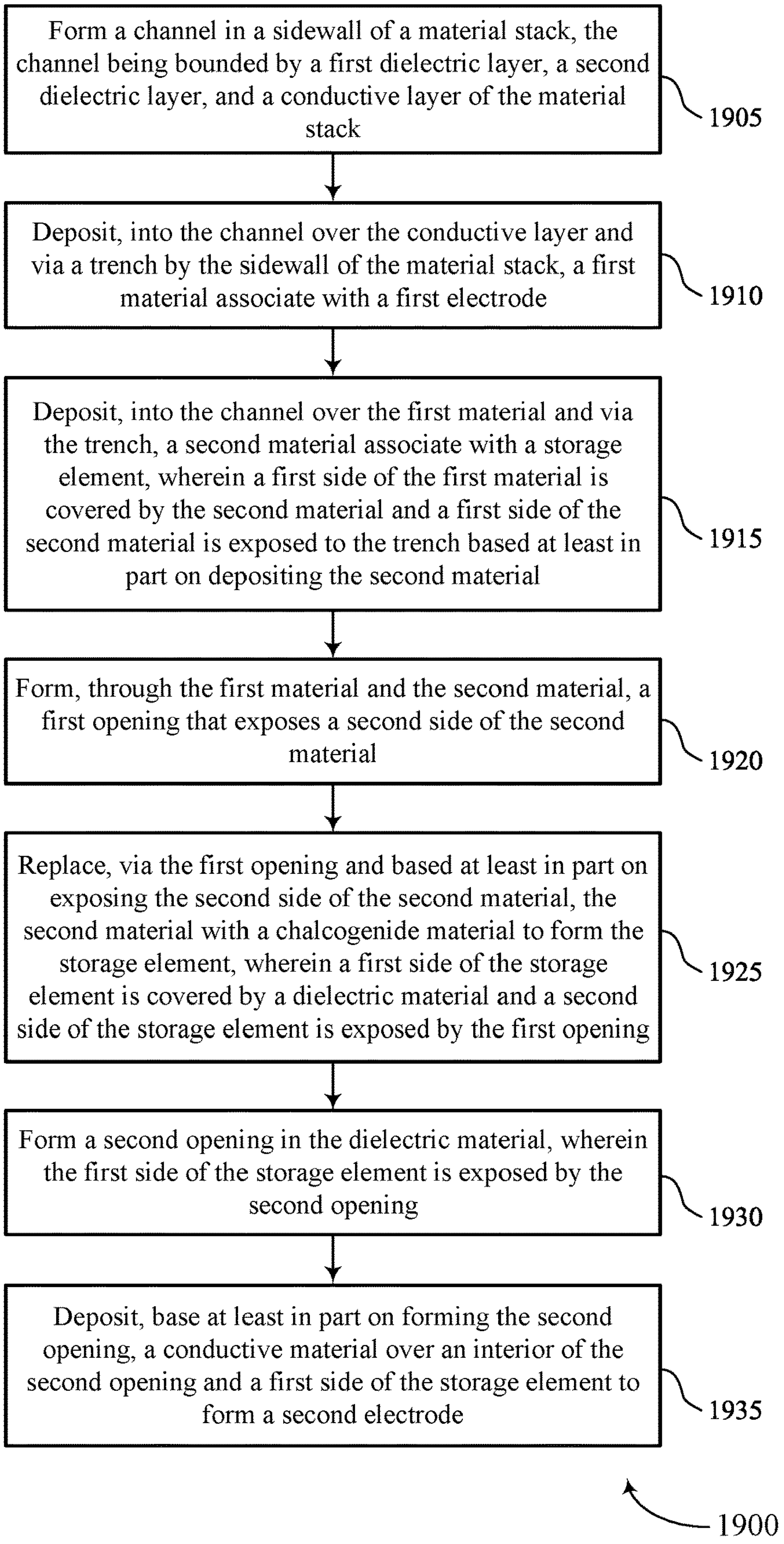

FIG. 19 shows a flowchart illustrating a method 1900 that supports a memory device with laterally formed memory cells in accordance with examples as disclosed herein. The operations of method 1900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1905, the method may include forming a channel in a sidewall of a material stack, the channel being bounded by a first dielectric layer, a second dielectric layer, and a conductive layer of the material stack. The operations of 1905 may be performed in accordance with examples as disclosed herein.

At 1910, the method may include depositing, into the channel over the conductive layer and via a trench by the sidewall of the material stack, a first material associated with a first electrode. The operations of 1910 may be performed in accordance with examples as disclosed herein.

At 1915, the method may include depositing, into the channel over the first material and via the trench, a second material associated with a storage element, where a first side of the first material is covered by the second material and a first side of the second material is exposed to the trench based at least in part on depositing the second material. The operations of 1915 may be performed in accordance with examples as disclosed herein.

At 1920, the method may include forming, through the first material and the second material, a first opening that exposes a second side of the second material. The operations of 1920 may be performed in accordance with examples as disclosed herein.

At 1925, the method may include replacing, via the first opening and based at least in part on exposing the second side of the second material, the second material with a chalcogenide material to form the storage element, where a first side of the storage element is covered by a dielectric material and a second side of the storage element is exposed by the first opening. The operations of 1925 may be performed in accordance with examples as disclosed herein.

At 1930, the method may include forming a second opening in the dielectric material, where the first side of the storage element is exposed by the second opening. The operations of 1930 may be performed in accordance with examples as disclosed herein.

At 1935, the method may include depositing, based at least in part on forming the second opening, a conductive material over an interior of the second opening and a first side of the storage element to form a second electrode. The operations of 1935 may be performed in accordance with examples as disclosed herein.

In some examples, an apparatus as described herein may perform a method or methods, such as the method 1900. The apparatus may include, features, circuitry, logic, means, or instructions (e.g., a non-transitory computer-readable medium storing instructions executable by a processor) for forming a channel in a sidewall of a material stack, the channel being bounded by a first dielectric layer, a second dielectric layer, and a conductive layer of the material stack, depositing, into the channel over the conductive layer and via a trench by the sidewall of the material stack, a first material associated with a first electrode, depositing, into the channel over the first material and via the trench, a second material associated with a storage element, where a first side of the first material is covered by the second material and a first side of the second material is exposed to the trench based at least in part on depositing the second material, forming, through the first material and the second material, a first opening that exposes a second side of the second material, replacing, via the first opening and based at least in part on exposing the second side of the second material, the second material with a chalcogenide material to form the storage element, where a first side of the storage element is covered by a dielectric material and a second side of the storage element is exposed by the first opening, forming a second opening in the dielectric material, where the first side of the storage element is exposed by the second opening, and depositing, based at least in part on forming the second opening, a conductive material over an interior of the second opening and a first side of the storage element to form a second electrode.

Some examples of the method 1900 and the apparatus described herein may further include operations, features, circuitry, logic, means, or instructions for replacing, via the first opening and before replacing the second material, the first material with a second conductive material to form the first electrode.

Some examples of the method 1900 and the apparatus described herein may further include operations, features, circuitry, logic, means, or instructions for filling the trench with the dielectric material based at least in part on depositing the second material into the channel and filling the first opening with a second dielectric material based at least in part on replacing the second material with the chalcogenide material, where the second opening may be formed through the dielectric material and the second dielectric material.

In some examples of the method 1900 and the apparatus described herein, depositing, into the second opening, a second conductive material over the conductive material to form a bit line.

In some examples of the method 1900 and the apparatus described herein, depositing the conductive material may include operations, features, circuitry, logic, means, or instructions for depositing the conductive material while maintaining a temperature of the conductive material below a threshold associated with the chalcogenide material.

Figure 20:
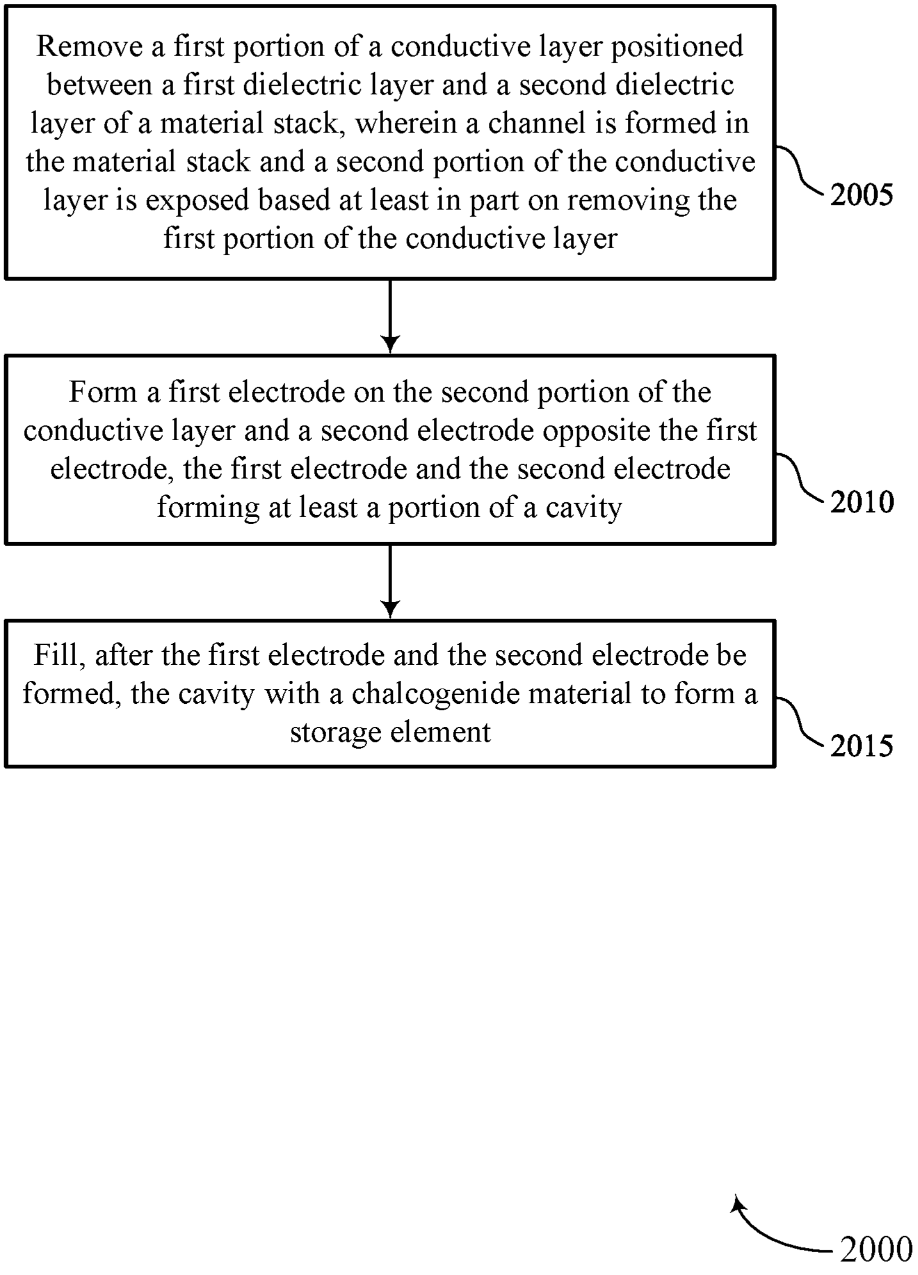

FIG. 20 shows a flowchart illustrating a method 2000 that supports a memory device with laterally formed memory cells in accordance with examples as disclosed herein. The operations of method 2000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 2005, the method may include removing a first portion of a conductive layer positioned between a first dielectric layer and a second dielectric layer of a material stack, where a channel is formed in the material stack and a second portion of the conductive layer is exposed based at least in part on removing the first portion of the conductive layer. The operations of 2005 may be performed in accordance with examples as disclosed herein.

At 2010, the method may include forming a first electrode on the second portion of the conductive layer and a second electrode opposite the first electrode, the first electrode and the second electrode forming at least a portion of a cavity. The operations of 2010 may be performed in accordance with examples as disclosed herein.

At 2015, the method may include filling, after the first electrode and the second electrode are formed, the cavity with a chalcogenide material to form a storage element. The operations of 2015 may be performed in accordance with examples as disclosed herein.

In some examples, an apparatus as described herein may perform a method or methods, such as the method 2000. The apparatus may include, features, circuitry, logic, means, or instructions (e.g., a non-transitory computer-readable medium storing instructions executable by a processor) for removing a first portion of a conductive layer positioned between a first dielectric layer and a second dielectric layer of a material stack, where a channel is formed in the material stack and a second portion of the conductive layer is exposed based at least in part on removing the first portion of the conductive layer, forming a first electrode on the second portion of the conductive layer and a second electrode opposite the first electrode, the first electrode and the second electrode forming at least a portion of a cavity, and filling, after the first electrode and the second electrode are formed, the cavity with a chalcogenide material to form a storage element.

Some examples of the method 2000 and the apparatus described herein may further include operations, features, circuitry, logic, means, or instructions for depositing a first material by the second portion of the conductive layer, a second material by the first material, and a third material by the second material and forming an opening through at least the second material and the third material that exposes a first side of the second material and a first side of the third material.

In some examples of the method 2000 and the apparatus described herein, forming the second electrode may include operations, features, means, or instructions for replacing, via the opening, a portion of the third material with a conductive material to form the second electrode, where a first side of the second electrode may be exposed by the opening and forming the cavity includes etching, after forming the second electrode, the first side of the second material to form the cavity.

Some examples of the method 2000 and the apparatus described herein may further include operations, features, circuitry, logic, means, or instructions for forming a second opening that exposes a second side of the second electrode and filling the second opening with a second conductive material to form a bit line that contacts the second side of the second electrode.

In some examples of the method 2000 and the apparatus described herein, the cavity may be filled via the opening from a first direction that may be perpendicular to a second direction of a current path through the storage element.

It should be noted that the methods described herein describe possible implementations, and that the operations and the steps may be rearranged or otherwise modified and that other implementations are possible. Furthermore, portions from two or more of the methods may be combined.

Another apparatus is described. The apparatus may include a word line including a first conductive material, a first electrode including a second conductive material, the first electrode being positioned by a first side of the word line, a storage element including a chalcogenide material, the storage element being positioned by a first side of the first electrode and a first material layer, a second electrode including a third conductive material, the second electrode being positioned by a first side of the storage element and a second material layer that is positioned by the first material layer, and a bit line including a fourth conductive material, the bit line being positioned by a first side of the second electrode.

In some examples of the apparatus, an edge of the first side of the storage element may be offset from an edge of the first side of the first electrode and an edge of the first side of the second electrode.

In some examples of the apparatus, the edge of the first side of the first electrode and the edge of the first side of the second electrode may be aligned.

In some examples of the apparatus, the storage element may be formed by filling a cavity between the first electrode and the second electrode.

In some examples of the apparatus, the first material layer includes silicon nitride and may be positioned by the first electrode and the second material layer includes aluminum oxide and may be positioned by the first material layer.

In some examples of the apparatus, a second side of the storage element and a second side of the second electrode may be coated with an aluminum oxide layer separating the storage element and the second electrode from a dielectric material.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "about" means that the modified characteristic (e.g., a verb or adjective modified by the term substantially) or a related aspect (e.g., related action or function), need not be absolute but is close enough to achieve the advantages of the characteristic or related aspect (e.g., related action or function).

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:

a word line comprising a first conductive material;

a first electrode comprising a second conductive material, the first electrode being positioned by a first side of the word line;

a storage element comprising a chalcogenide material, the storage element being positioned by a first side of the first electrode and a first material layer;

a second electrode comprising a third conductive material, the second electrode being positioned by a first side of the storage element and a second material layer that is positioned by the first material layer, wherein an edge of the first side of the storage element is offset from both an edge of the first side of the first electrode and an edge of the first side of the second electrode; and a bit line comprising a fourth conductive material, the bit line being positioned by a first side of the second electrode.

2. The apparatus of claim 1, wherein the edge of the first side of the first electrode and the edge of the first side of the second electrode are aligned.

3. The apparatus of claim 1, wherein the storage element is formed by filling a cavity between the first electrode and the second electrode.

4. The apparatus of claim 1, wherein:

the first material layer comprises silicon nitride and is positioned by the first electrode, and the second material layer comprises aluminum oxide and is positioned by the first material layer.

5. The apparatus of claim 1, wherein a second side of the storage element and a second side of the second electrode is coated with an aluminum oxide layer separating the storage element and the second electrode from a dielectric material.

6. An apparatus, comprising:

a word line;

a first electrode positioned by a first side of the word line;

a storage element positioned by a first side of the first electrode and a first material layer;

a second electrode positioned by a first side of the storage element and a second material layer that is positioned by the first material layer; and a bit line positioned by a first side of the second electrode, wherein a first edge of a first side of the bit line is offset in a first direction from a first edge of the first side of the storage element, and a second edge of the first side of the bit line is offset in a second direction from a second edge of the first side of the storage element, the second direction being different than the first direction, wherein the first edge of the first side of the storage element is offset in the first direction from both a first edge of the first side of the first electrode and in the first direction from a first edge of the first side of the second electrode, and wherein the second edge of the first side of the storage element is aligned with both a second edge of the first side of the first electrode and a second edge of the first side of the second electrode.

7. The apparatus of claim 6, further comprising:

a protective liner positioned by the first electrode, the storage element, the second electrode, and the bit line.

8. The apparatus of claim 6, further comprising:

a third electrode positioned by a first side of the bit line;

a second storage element positioned by a first side of the third electrode, a fourth electrode positioned by a first side of the second storage element; and a second word line positioned by a first side of the fourth electrode.

9. The apparatus of claim 8, further comprising:

a protective liner positioned by the first electrode, the storage element, the second electrode, and the bit line.

10. The apparatus of claim 6, wherein:

the second electrode extends at least in part around the bit line.

11. The apparatus of claim 6, further comprising:

a third electrode positioned by the first side of the word line;

a second storage element positioned by a first side of the third electrode, a fourth electrode positioned by a first side of the second storage element; and a second bit line positioned by a first side of the fourth electrode.

12. The apparatus of claim 6, wherein:

the first edge of the first side of the storage element is aligned with a first edge of the first side of the first electrode and offset in the first direction from a first edge of the first side of the second electrode, and the second edge of the first side of the storage element is aligned with a second edge of the first side of the first electrode and offset in the second direction from a second edge of the first side of the second electrode.

13. An apparatus, comprising:

a word line;

a first electrode positioned by a first side of the word line;

a storage element positioned by a first side of the first electrode and a first material layer;

a second electrode positioned by a first side of the storage element and a second material layer that is positioned by the first material layer;

a bit line positioned by a first side of the second electrode; and a protective liner, wherein a first edge of the first side of the second electrode and a first edge of a first side of the storage element are aligned and positioned by the protective liner, and wherein a second edge of the first side of the second electrode is offset from a second edge of the first side of the storage element.

14. The apparatus of claim 13, wherein:

a first edge of a first side of the bit line is offset in a first direction from a first edge of the first side of the storage element, and a second edge of the first side of the bit line is offset in the first direction from a second edge of the first side of the storage element.

15. The apparatus of claim 13, wherein:

the second electrode extends at least in part around the bit line.

16. The apparatus of claim 13, further comprising:

a second storage element positioned by a second side of the second electrode, a third electrode positioned by a first side of the second storage element; and a second word line positioned by a first side of the third electrode.

17. The apparatus of claim 13, further comprising:

a second storage element by the first side of the first electrode, the second storage element being separated from the storage element by at least the protective liner.

* * * * *